(12) United States Patent
Sugibayashi et al.

(10) Patent No.: US 7,414,881 B2
(45) Date of Patent: Aug. 19, 2008

(54) MAGNETIZATION DIRECTION CONTROL METHOD AND APPLICATION THEREOF TO MRAM

(75) Inventors: Tadahiko Sugibayashi, Tokyo (JP); Takeshi Honda, Tokyo (JP); Noboru Sakimura, Tokyo (JP)

(73) Assignee: NEC Corporation, Tokyo (JP)

( * ) Notice: Subject to any disclaimer, the term of this patent is extended or adjusted under 35 U.S.C. 154(b) by 142 days.

(21) Appl. No.: 11/547,123

(22) PCT Filed: Mar. 24, 2005

(86) PCT No.: PCT/JP2005/005325

§ 371 (c)(1),
(2), (4) Date: Oct. 2, 2006

(87) PCT Pub. No.: WO2005/098953

PCT Pub. Date: Oct. 20, 2005

(65) Prior Publication Data

US 2007/0201168 A1    Aug. 30, 2007

(30) Foreign Application Priority Data

Mar. 31, 2004    (JP)    ............................. 2004-104683

(51) Int. Cl.
*G11C 11/00* (2006.01)
(52) U.S. Cl. .................. 365/158; 365/173; 365/145
(58) Field of Classification Search .................. 365/158, 365/145, 173
See application file for complete search history.

(56) References Cited

U.S. PATENT DOCUMENTS

| | | | |
|---|---|---|---|
| 6,233,172 B1 * | 5/2001 | Chen et al. .................. 365/173 |
| 6,545,906 B1 | 4/2003 | Savtchenko et al. |
| 6,567,246 B1 * | 5/2003 | Sakakima et al. ...... 360/324.11 |
| 6,777,730 B2 * | 8/2004 | Daughton et al. ........... 257/295 |
| 7,075,814 B2 * | 7/2006 | Brueckl et al. ............... 365/158 |
| 7,190,611 B2 * | 3/2007 | Nguyen et al. ............... 365/158 |
| 2005/0057992 A1 * | 3/2005 | Yagami ...................... 365/222 |

FOREIGN PATENT DOCUMENTS

| | | |
|---|---|---|
| JP | 2000-113418 A | 4/2000 |
| JP | 2003-8100 A | 1/2003 |
| JP | 2003-016624 A | 1/2003 |
| JP | 2003-197872 A | 7/2003 |
| JP | 2003-309305 A | 10/2003 |
| JP | 2003-536267 A | 12/2003 |

* cited by examiner

*Primary Examiner*—Tuan T. Nguyen
(74) *Attorney, Agent, or Firm*—Sughrue Mion, PLLC

(57) ABSTRACT

A magnetization direction control method for controlling magnetization directions of first to third ferromagnetic layers (11-13) within a synthetic antiferromagnet structure (10A) having the first to the third ferromagnetic layers (11-13) and first and second non-magnetic layers (21, 22) interposed therebetween, without coupling antiferromagnetic material. The magnetization direction control method is composed of steps of (a) applying an external magnetic field $H_E$ to the synthetic antiferromagnet structure (10A) so as to direct the magnetizations of the first to third ferromagnetic layers in the same direction, and (b) reducing the external magnetic field to reverse the magnetization of one or some of the first to third ferromagnetic layers (11-13). The synthetic antiferromagnet structure (10A) is configured so that the magnetization of the first ferromagnetic layer (11) is reversed more easily than magnetizations of the other ferromagnetic layers in a state in which the magnetizations of the first to third ferromagnetic layers (11-13) are directed in the same direction.

27 Claims, 28 Drawing Sheets

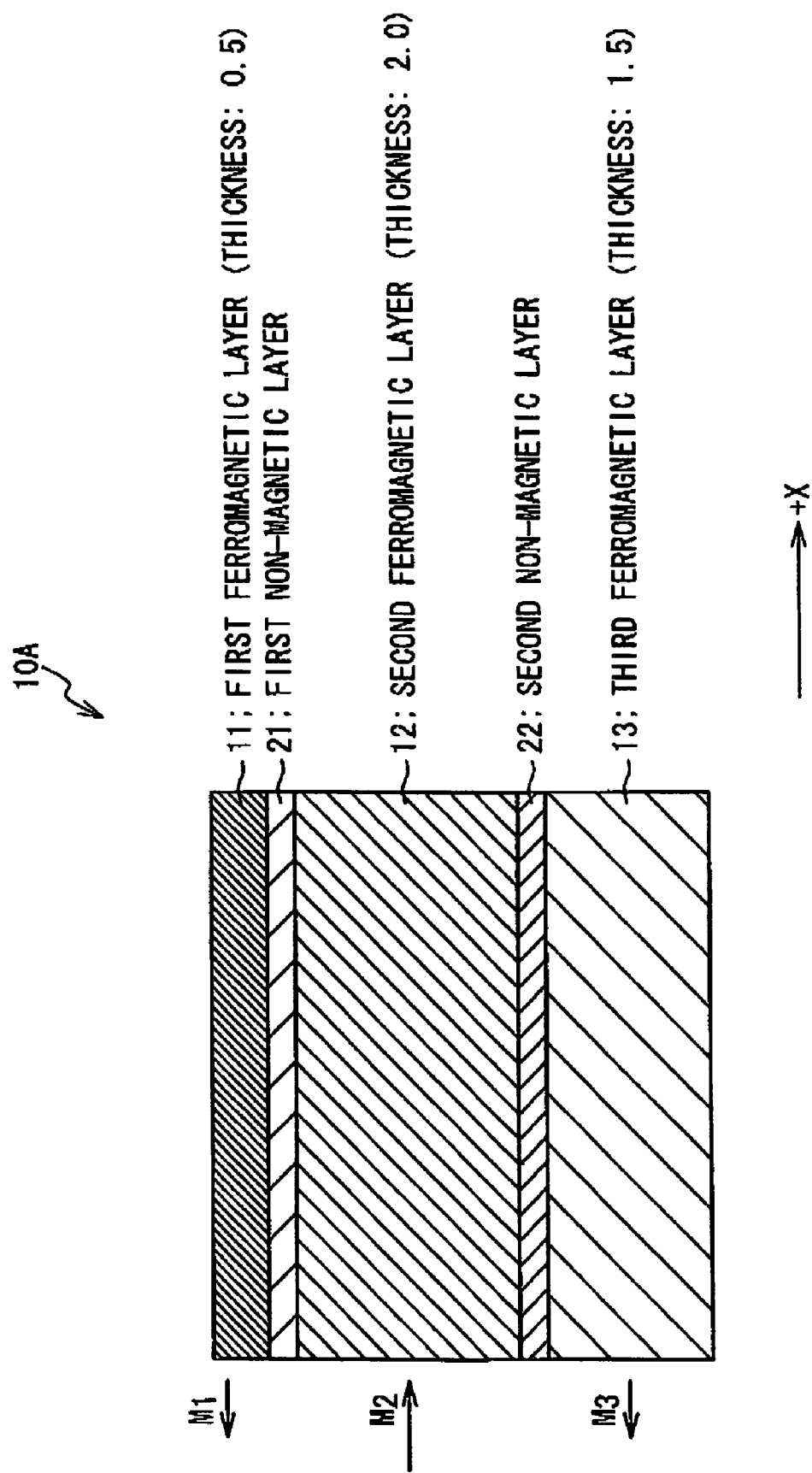

Fig. 9A
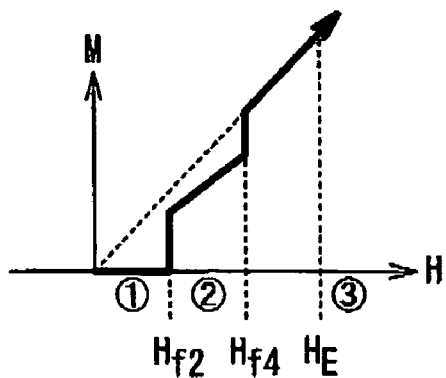 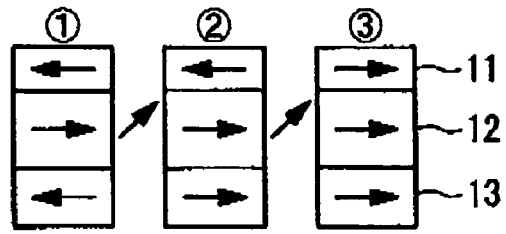
Fig. 9B
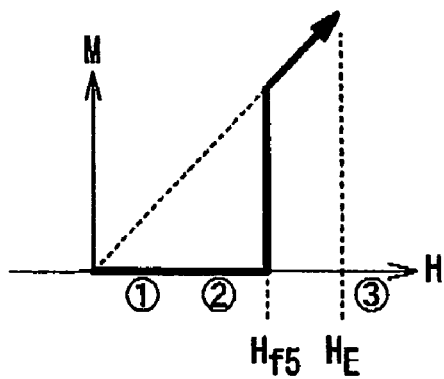 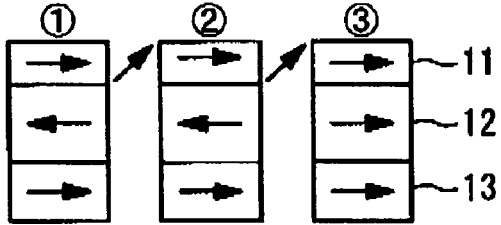
Fig. 9C
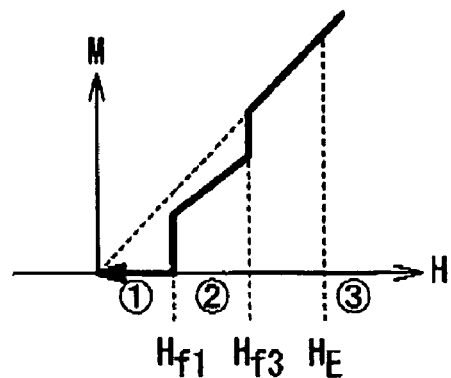 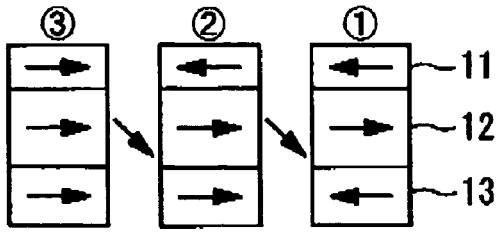

Fig. 18
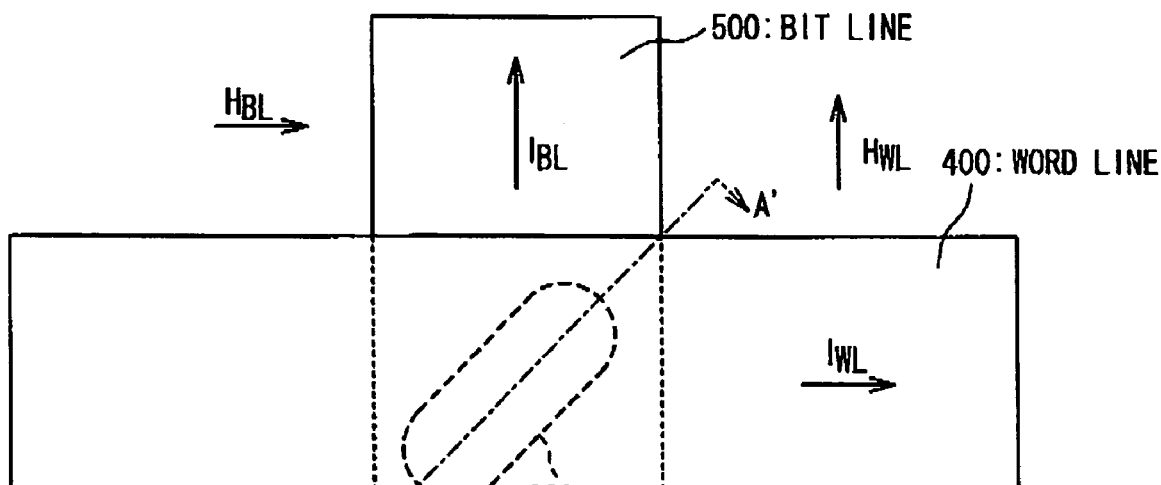
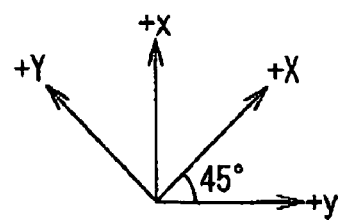

US 7,414,881 B2

MAGNETIZATION DIRECTION CONTROL METHOD AND APPLICATION THEREOF TO MRAM

TECHNICAL FIELD

This application claims priority from PCT Application No. PCT/JP2005/005325 filed Mar. 24, 2005, and from Japanese Patent Application No. 2004-104683 filed Mar. 31, 2004, which applications are incorporated herein by reference.

The present invention relates to a magnetic random access memory (MRAM), and in particular to the improvement of an MRAM memory cell in which a synthetic antiferromagnet structure is employed as a fixed layer and/or a free layer.

BACKGROUND ART

A synthetic antiferromagnet structure designates a structure composed of a plurality of ferromagnetic layers and an intermediate non-magnetic layer(s) interposed therebetween. The synthetic antiferromagnet structure is configured so as to antiferromagnetically couple the adjacent ferromagnetic layers. More specifically, each intermediate non-magnetic layer is formed of material with a film thickness so that the adjacent ferromagnetic layers are antiferromagnetically coupled. It is well-known to those skilled in the art of the MRAM that the adjacent ferromagnetic layers can be antiferromagnetically coupled by appropriately determining material and the film thickness of the intermediate non-magnetic layer.

For example, as disclosed in published Japanese translations of PCT international publication No. 2003-536267, the synthetic antiferromagnet structure is often used as a fixed layer (pinned layer) of the MRAM memory cell. One advantage of using the synthetic antiferromagnet structure as a fixed layer of the MRAM memory cell is to decrease an undesired bias magnetic field applied to a free layer of the MRAM memory cell. This results from the fact that the synthetic antiferromagnet structure allows decreasing a total magnetic moment down to ideally zero. Since a magnetic field generated by the synthetic antiferromagnet structure is proportional to the magnitude of the magnetic moment, a magnetic field applied to a free layer from a fixed layer can be decreased by using a synthetic antiferromagnet structure as the fixed ferromagnetic layer.

In recent years, a technique has been studied which uses synthetic antiferromagnet structures as the free layer of the MRAM memory cell. U.S. Pat. No. 6,545,906 discloses a technique for improving the selectivity of memory cells and data retention properties, and further to suppress the shape dependency of a coercive field by applying the synthetic antiferromagnet structure to the free layer.

In order to employ the synthetic antiferromagnet structure in the MRAM memory cell, there is required a technique to direct magnetizations of ferromagnetic layers within the synthetic antiferromagnet structure to desired directions. The fixed layer is required to have magnetizations of the synthetic antiferromagnet structure directed to desired directions in the MRAM manufacturing process. The free layer, on the other hand, is required to have magnetizations of the synthetic antiferromagnet structure directed to a direction corresponding to data to be written to the MRAM memory cell.

When the synthetic antiferromagnet structure is used as the fixed layer, the magnetization directions of ferromagnetic layers within the synthetic antiferromagnet structure are most typically controlled by using an antiferromagnetic layer. FIG. 1 is a cross-sectional view showing a typical structure of the MRAM memory cell in which the synthetic antiferromagnet structure is used as the fixed layer. An MRAM memory cell 1000 includes a fixed layer 1100, a free layer 1200, and a tunnel barrier layer 1300 interposed therebetween. The fixed layer 1100 is formed of a synthetic antiferromagnet structure. More specifically, the fixed layer 1100 is composed of ferromagnetic layers 1101 to 1103 and non-magnetic layers 1111 and 1112 interposed therebetween. The fixed layer 1100 is connected to an antiferromagnetic layer 1400, thereby magnetizations of the ferromagnetic layers 1101 to 1103 are fixed.

The magnetization directions of the ferromagnetic layers 1101 to 1103 are controlled by annealing while applying a strong external magnetic field. Specifically, a strong magnetic field is applied to the MRAM memory cell 1000 so as to align the magnetizations of the ferromagnetic layers 1101 to 1103 in the same direction. When the external magnetic field has been removed, the magnetization of one of the ferromagnetic layers 1101 to 1103 is reversed, thereby the magnetizations of the ferromagnetic layers 1101 to 1103 are rearranged to directions so that the synthetic antiferromagnet structure is stabilized in terms of energy. In this rearrangement, the magnetization of the ferromagnetic layer 1103 is not reversed because a magnetization reversal thereof is prevented by an exchange interaction from the antiferromagnetic layer 1400; the magnetization of the ferromagnetic layer 1103 is fixed to the direction of the external magnetic field. Accordingly, in order to stabilize the synthetic antiferromagnet structure in terms of energy, the magnetization of the ferromagnetic layer 1102 is reversed to the direction opposite to the external magnetic field, and the magnetization of the ferromagnetic layer 1101 is directed to the same direction with the external magnetic field without being reversed. This implies that the magnetizations of the ferromagnetic layers 1101 to 1103 are directed to the desired directions by applying the external magnetic field to a direction to which the magnetizations of the ferromagnetic layers 1101 and 1103 are to be directed.

In the magnetization direction control mentioned above, the antiferromagnetic layer 1400 is coupled to the synthetic antiferromagnet structure so as to fix final magnetization directions of the ferromagnetic layers 1101 to 1103. The antiferromagnetic layer 1400 plays an important role in controlling the magnetization directions.

On the other hand, U.S. Pat. No. 6,545,906 discloses a method for reversing magnetization directions of ferromagnetic layers within the synthetic antiferromagnet structure to the desired directions when the synthetic antiferromagnet structure is used as the free layer, which is specifically a method for writing data to the synthetic antiferromagnet structure. This U.S. Pat. No. 6,545,906 discloses two methods for writing data to the synthetic antiferromagnet structure: the toggle writing method and the direct writing method.

FIG. 2 is a cross sectional view showing a structure of an MRAM memory array disclosed in U.S. Pat. No. 6,545,906, and FIG. 3 is a plane view showing a structure of the above MRAM memory array. As shown in FIG. 2, the MRAM memory array includes a word line 2400, a bit line 2500, and a memory cell 2000 interposed therebetween. The memory cell 2000 is composed of a fixed layer 2100, a free layer 2200, and a tunnel barrier layer 2300 interposed therebetween. The fixed layer 2100 and the free layer 2200 are both composed of the synthetic antiferromagnet structure. The fixed layer 2100 includes ferromagnetic layers 2101 and 2102, and a non-magnetic layer 2103 interposed therebetween, while the free layer 2200 includes ferromagnetic layers 2201 and 2202, and a non-magnetic layer 2203 interposed therebetween.

As shown in FIG. 3, easy axes of the ferromagnetic layers 2201 and 2202 are directed at an angle of 45 degrees to both the word line 2400 and the bit line 2500. A magnetization $M_1$, of the ferromagnetic layer 2201 and a magnetization $M_2$ of the ferromagnetic layer 2202 are antiparallelly directed each other along the direction of the easy axes.

FIGS. 4 and 5 show a procedure of the toggle writing method disclosed in U.S. Pat. No. 6,545,906. Referring to FIG. 5, it should be noted that an x-y coordinate system is introduced below for convenience of explanation. In the x-y coordinate system, the direction of the x-axis is defined as being parallel to the word line 2400, and the direction of the y-axis is defined as being parallel to the bit line 2500.

In the toggle writing method, as shown in FIG. 4, a current $I_{WL}$ is applied to the word line 2400 in the +x direction at the time $t_1$. As shown in FIG. 5, the application of the current $I_{WL}$ generates a magnetic field $H_{WL}$ in the +y direction, and the magnetic field $H_{WL}$ causes the magnetization $M_1$ of the ferromagnetic layer 2201 and the magnetization $M_2$ of the ferromagnetic layer 2202 to be slightly rotated in the +y direction. The rotation angle of the magnetizations $M_1$ and $M_2$ is an angle in which a resultant magnetization $M_R$ thereof is in parallel with the +y direction.

Subsequently, a current $I_{BL}$ is applied to the bit line 2500 in the +x direction at a time $t_2$. The application of the current $I_{BL}$ generates a resultant magnetic field $H_{WL}+H_{BL}$ at an angle of 45 degrees to both the x-axis and the y-axis. This resultant magnetic field $H_{WL}+H_{BL}$ causes the magnetizations $M_1$ and $M_2$ to be rotated clockwise so that the resultant magnetization $M_R$ is directed in parallel to the resultant magnetic field $H_{WL}+H_{BL}$.

This is followed by shutting off the current $I_{WL}$ applied to the word line 2400 at the time $t_3$. The shutoff of the current $I_{WL}$ causes only the magnetic field $H_{BL}$ to be applied to the ferromagnetic layers 2201 and 2202 in the +x direction. This magnetic field $H_{BL}$ causes the magnetizations $M_1$ and $M_2$ to be further rotated clockwise so that the resultant magnetization $M_R$ is directed in parallel to the magnetic field $H_{BL}$.

Finally, the current $I_{BL}$ applied to the bit line 2500 is shut off at the time $t_4$. The shutoff of the current $I_{BL}$ results in that the magnetic fields stop being applied to the magnetizations $M_1$ and $M_2$, and the magnetizations $M_1$ and $M_2$ are redirected along the closest easy axis. As a result, the magnetization $M_1$ and $M_2$ are reversed to the direction opposite to the original direction.

One feature of the toggle writing method is that the magnetizations $M_1$ and $M_2$ are reversed every time the toggle writing is performed, regardless of the original directions of the magnetizations $M_1$ and $M_2$.

On the other hand, the direct writing method is a method in which it depends on the original direction of the magnetizations $M_1$ and $M_2$ whether or not the magnetizations $M_1$ and $M_2$ are reversed, as shown in FIGS. 6 and 7. The direct writing method controls the reversal of the magnetizations $M_1$ and $M_2$ by using the resultant magnetization $M_R$ that initially exists in the synthetic antiferromagnet structure due to the unbalance of the magnetizations $M_1$ and $M_2$. More specifically, as shown in FIG. 6, the application of the magnetic field $H_{WL}$ causes the magnetizations $M_1$ and $M_2$ to be largely rotated clockwise, if the direction of the magnetic field $H_{WL}$ generated by the application of the current $I_{WL}$ forms an obtuse angle to the direction of the resultant magnetic field $M_R$ with no magnetic field applied. In this case, the magnetizations $M_1$ and $M_2$ to be reversed when the magnetic field $H_{BL}$ is then applied. On the other hand, as shown in FIG. 7, the magnetizations $M_1$ and $M_2$ is not reversed, if the direction of the magnetic field $H_{WL}$ forms an acute angle to the direction of the resultant magnetization $M_R$ with no magnetic field applied. It should be noted that the initial existence of the resultant magnetization $M_R$ is important in the direct writing method.

There is room for improvement in the above-mentioned prior arts in the following points. The technique to control magnetizations of ferromagnetic layers in the synthetic antiferromagnet structure using the antiferromagnetic layer suffers from a problem of the diffusion of materials of the antiferromagnetic layer. Anti-ferromagnetic material used in the MRAM generally includes manganese (Mn); however, manganese within the antiferromagnetic material diffuses in a heat treatment at a high temperature. The diffusion of manganese undesirably causes deterioration of the characteristics of the MRAM memory cell.

The toggle writing method disclosed in U.S. Pat. No. 6,545,906, on the other hand, suffers from a drawback that a read operation is required before performing a write operation. The toggle writing results in reversal of the magnetizations of the ferromagnetic layers within the synthetic antiferromagnet structure, regardless of the original states. Accordingly, in order to direct the magnetizations toward the desired directions, magnetization directions of the ferromagnetic layers of the synthetic antiferromagnet structure are determined before writing data to the synthetic antiferromagnet structure, which implies the read operation needs to be executed. Therefore, the toggle writing operation is essentially unsuitable for controlling the magnetizations of the ferromagnetic layers of the synthetic antiferromagnet structure used as the fixed layer. When the synthetic antiferromagnet structure is used as a free layer, the fact that the read operation needs to be executed before a write operation is not preferable, because the write cycle time is increased.

In addition, the direct writing method disclosed in U.S. Pat. No. 6,545,906 suffers from a drawback that the magnetizations of the synthetic antiferromagnet structure are not essentially balanced, that is, the initial existence of the resultant magnetization is required. The existence of the resultant magnetization implies that the synthetic antiferromagnet structure has a magnetic moment and the synthetic antiferromagnet structure generates the magnetic field accordingly. This causes magnetic interference to be generated between adjacent MRAM memory cells. This is not preferable because the advantages of the synthetic antiferromagnet structure are reduced in a sense.

Japanese Laid Open Patent Applications Nos. 2003-8100 and 2003-309305 disclose other techniques to utilize the synthetic antiferromagnet structure as the free layer. However, these techniques are aimed to improve a reproduced output of a magnetic head. These documents do not refer to anything about an MRAM data writing or a magnetization direction control of the fixed layer.

In addition, Japanese Laid Open Patent Application No. 2003-16624 discloses a magnetic recording medium including a synthetic antiferromagnet structure. However, this document does not disclose anything about the MRAM data writing or the magnetization direction control of the fixed layer.

From the background as described above, there is a need for providing a new technique for the control of the magnetization direction of ferromagnetic material within a synthetic antiferromagnet structure.

DISCLOSURE OF INVENTION

Generally, the present invention is aimed to provide a new technique to control magnetization directions of ferromagnetic layers within a synthetic antiferromagnet structure.

Specifically, one object of the present invention is to provide a technique for controlling magnetization directions of ferromagnetic layers within a synthetic antiferromagnet structure without using antiferromagnetic material.

Another object of the present invention is to provide a technique for directing magnetization directions of ferromagnetic layers within a synthetic antiferromagnet structure to desired directions without depending on the original state of the magnetizations of the ferromagnetic layers of the synthetic antiferromagnet structure.

Still another object of the present invention is to provide a technique for directing magnetization directions of ferromagnetic layers within a synthetic antiferromagnet structure to desired directions while keeping the net magnetic moment of the synthetic antiferromagnet structure to be zero.

Still another object of the present invention is to realize an MRAM with high selectivity of memory cells in write operations by using a new technique to control the magnetization directions of the ferromagnetic layers of the synthetic antiferromagnet structure.

A basic principle of the present invention is to direct desired magnetizations of the ferromagnetic layers to the desired directions by controlling easiness of magnetization reversal of respective ferromagnetic layers in a state in which the magnetizations of the ferromagnetic layers with the synthetic antiferromagnet structure are aligned in the same direction. In the present invention, magnetizations of the ferromagnetic layers within the synthetic antiferromagnet structure are aligned once in the same direction by applying the external magnetic field, thereafter the external magnetic field is decreased. In decreasing the external magnetic field, one or some of the magnetizations of the ferromagnetic layers within the synthetic antiferromagnet structure are reversed by an antiferromagnetic coupling exerted between the adjacent ferromagnetic layers. In the present invention, magnetizations of the desired ferromagnetic layers are directed to desired directions by controlling the easiness of reversal the magnetization of each ferromagnetic layer during the decrease of the external magnetic field. The magnetization direction control of the ferromagnetic layers within the synthetic antiferromagnet structure according to this principle does not essentially require the existence of the antiferromagnetic layer.

More specifically, the present invention employs the following techniques to achieve the objects mentioned above. In one aspect of the present invention, a magnetization direction control method addresses providing a synthetic antiferromagnet structure composed of N-layered ferromagnetic layers and N−1 layered non-magnetic layers interposed therebetween with a method to control magnetization directions of the N-layered ferromagnetic layers without connecting antiferromagnetic material, N being an integer equal to or more than three. The magnetization direction control method is composed of the steps of;

(a) directing the magnetizations of the N-layered ferromagnetic layers to substantially the same direction by applying an external magnetic field to the synthetic antiferromagnet structure, and;

(b) reversing magnetization(s) of one or some of the N-layered ferromagnetic layers by decreasing the external magnetic magnetization. The synthetic antiferromagnet structure is composed so that the magnetization of one ferromagnetic layer out of the N-layered ferromagnetic layers is reversed more easily than other magnetizations of the ferromagnetic layers in a state in which the magnetizations of the N-layered ferromagnetic layers are directed in the same direction.

In the magnetization direction control method, the magnetization of the one ferromagnetic layer is destined to be firstly reversed in the process of decreasing the external field ((b) process). Accordingly, the magnetization direction of the one ferromagnetic layer is decided to be a direction opposite to the external magnetization. Once the magnetization direction of the one ferromagnetic layer has been decided, the magnetization directions of the ferromagnetic layers adjacent to the one ferromagnetic layer are decided; in an ideal case, the magnetization directions of the ferromagnetic layers are entirely decided. The fact that the magnetization of a certain one ferromagnetic layer is destined to be firstly reversed in a process of decreasing the external magnetization is effective for directing the magnetization directions of the ferromagnetic layers of the synthetic antiferromagnet structure to the desired directions.

There are two approaches to structuring the synthetic antierromagnet structure so that the magnetization of the certain one ferromagnetic layer is reversed first: One approach is to optimize the film thicknesses and the magnetization magnitudes of the respective ferromagnetic layers, and another approach is to optimize strength of the antiferromagnetic coupling exerted between adjacent ferromagnetic layers. When the former approach is employed, the synthetic antiferromagnet structure is composed so that the product of the film thickness and magnetization magnitude of the one ferromagnetic layer is smaller than those of the other ferromagnetic layers. When the later method is employed, on the other hand, the material and film thickness of each non-magnetic layer are optimized. These two methods may be both used.

In both cases, it is important that the number of ferromagnetic layers within the synthetic antiferromagnet structure is equal to or more than three. When the number of ferromagnetic layers is two, this makes it impossible to adjust the net magnetic moment of the synthetic antiferromagnet structure to be zero in optimizing the film thickness and the magnetization magnitude. This is because the structure of the synthetic antiferromagnet structure having only two ferromagnetic layers in which the product of the film thickness and the magnetization magnitude of one ferromagnetic layer is smaller than that of the other ferromagnetic layer implies that the net magnetic moment is not zero. On the other hand, the optimization of the strength of the antiferromagnetic coupling essentially requires ferromagnetic layers of equal to or more than three. This is because the optimization of the strength of the antiferromagnetic layer in the synthetic antiferromagnet structure having two-layered ferromagnetic layers does not influence the order of reversing the magnetizations of the ferromagnetic layers.

In the optimization of the film thicknesses and magnetization magnitudes, the N-layered ferromagnetic layers may be formed by the same ferromagnetic material. In this case, one of the ferromagnetic layers is formed to be thinner in the film thickness than those of the other ferromagnetic layers. The structure mentioned above is effective for reducing the manufacturing cost.

If the one ferromagnetic layer is selected from odd-numbered ferromagnetic layers of the N-layered ferromagnetic layers, the products of the film thicknesses and magnetization magnitudes of the respective odd-numbered ferromagnetic layers are preferably smaller than the products of the film thicknesses and magnetization magnitudes of the respective even-numbered ferromagnetic layers. This allows selectively and exclusively reversing the magnetizations of the odd-numbered ferromagnetic layers in the process of decreasing the external magnetic field.

Correspondingly, when the one ferromagnetic layer is selected from the even-numbered ferromagnetic layers out of the N-layered ferromagnetic layers, the products of the film thicknesses and the magnitudes of the magnetization of the respective even-numbered ferromagnetic layers are preferably smaller than the products of the film thicknesses and the magnetization magnitudes of the respective odd-numbered ferromagnetic layers.

When the number of the ferromagnetic layers of the synthetic antiferromagnet structure is three and the one ferromagnetic layer is formed to be thinner in the film thickness than the other ferromagnetic layers, the one ferromagnetic layer is preferably the ferromagnetic layer located on the end of the synthetic antiferromagnet structure. The structure mentioned above is important to adjust the net magnetic moment of the synthetic antiferromagnet structure to zero. If the one ferromagnetic layer is an intermediate ferromagnetic layer, the net magnetic moment of the synthetic antiferromagnet structure is never adjusted to be zero.

When the strength of the antiferromagnetic coupling is optimized, the synthetic antiferromagnet structure is preferably composed so that the magnetization of the one ferromagnetic layer is revered easier than the magnetizations of the other ferromagnetic layers by differentiating the coupling coefficient of the antiferromagnetic coupling across one non-magnetic layer out of the N−1 layered non-magnetic layers from the coupling coefficient of the antiferromagnetic coupling across the other non-magnetic layer(s).

In a preferred embodiment, the N−1 layered non-magnetic layers are structured so that the strength of the antiferromagnetic coupling between the one ferromagnetic layer and the adjacent ferromagnetic layers is greater than the strength of the antiferromagnetic coupling(s) between the other adjacent ferromagnetic layers.

When the number of ferromagnetic layers included in the synthetic antiferromagnet structure is four, the one ferromagnetic layer is preferably selected from two intermediate ferromagnetic layers of the synthetic antiferromagnet structure. The structure mentioned above allows the first reversal of the magnetization of the one ferromagnetic layer to destine the magnetization directions of the remaining ferromagnetic layers. This is preferable to direct the magnetizations of the respective ferromagnetic layers to desired directions.

Similarly, when the number of the ferromagnetic layers included in the synthetic antiferromagnet structure is five, the one ferromagnetic layer is preferably the third ferromagnetic layer in the synthetic antiferromagnet structure. This structure allows the first reversal of the magnetization of the one ferromagnetic layer to destine the magnetization directions of the remaining ferromagnetic layers. In another aspect, an MRAM manufacturing method according to the present invention is composed of the steps of:

(c) forming a memory cell having a structure in which a synthetic antiferromagnet structure including N-layered ferromagnetic layers (N is an integer of equal to or more than three) and non-magnetic layers interposed therebetween is included as a fixed layer, and no antiferromagnetic material is in contact with the synthetic antiferromagnet structure;
(d) directing magnetizations of the N-layered ferromagnetic layers in substantially the same direction by applying an external magnetic field to the synthetic antiferromagnet structure; and
(e) reversing the magnetizations of the one or some of the N-layered ferromagnetic layers by decreasing the external magnetization.

The synthetic antiferromagnet structure is configured so that a magnetization of one ferromagnetic layer among the N-layered ferromagnetic layer is reversed more easily than magnetizations of the other ferromagnetic layers in a state in which the magnetizations of the N-layered ferromagnetic layers are directed in the same direction.

The MRAM manufacturing method allows the directions of magnetizations of ferromagnetic layers within the synthetic antiferromagnet structure used as the fixed layer to be directed to desired directions without using the antiferromagnetic layer.

In still another aspect, the MRAM according to the present invention is composed of a plurality of first interconnections extended in a first direction; a plurality of second interconnections extended in a second direction perpendicular to the first direction; memory cells disposed at respective intersections of the first and second interconnections, and a write circuit which feeds a first write current to a first selected interconnection selected from the plurality of the first interconnections and feeds a second write current to a second selected interconnections selected from the plurality of the second interconnections. Each of the memory cells includes a fixed layer, a free layer formed of a synthetic antiferromagnet structure including N-layered ferromagnetic layers (N is an integer of equal to or more than three) and non-magnetic layers interposed therebetween, and a spacer layer interposed between the free layer and the fixed layer. Easy axes of the N-layered ferromagnetic layers are directed obliquely to both of the first direction and the second direction. The synthetic antiferromagnet structure is composed so that a magnetization of one ferromagnetic layer out of the N-layered ferromagnetic layers is reversed more easily than the magnetizations of other ferromagnetic layers in a state in which the magnetizations of the N-layered ferromagnetic layers are directed in the same direction. The first write current and the second write current are provided so as to generate, in a parallel direction to the easy axes, the resultant magnetic field having the strength to align, in substantially the same direction, the magnetizations of the N-layered ferromagnetic layers within the synthetic antiferromagnet structure of the memory cell at which both the first selected interconnection and the second selected interconnection are crossed.

The MRAM is capable of realizing a data writing without depending on the initial state of the magnetizations of the ferromagnetic layers by using the above-described magnetization direction control method while the net magnetic moment of the free layer is adjusted to be zero. In addition, the MRAM is capable of improving the selectivity of the memory cells by employing the synthetic antiferromagnet structure as the free layer.

The directions of the easy axes are preferably at an angle of 45 degrees to both of the first direction and the second direction. Such structure provides the highest selectivity of the memory cells.

In a preferred embodiment, the first write current and the second write current start to be fed substantially at the same time. Differently from the conventional MRAM mentioned above, the MRAM according to the present invention does not require starting to feed the second current after starting to feed the first current. This is effective to reduce a write access time.

In still another aspect, an MRAM operation method according to the present invention is aimed at an MRAM composed of a plurality of first interconnections extended in the first direction, a plurality of second interconnections extended in a second direction perpendicular to the first direction, and memory cells disposed at respective intersection of the first and second interconnections, each of the memory cells being provided with a fixed layer, a free layer formed of a synthetic antiferromagnet structure having N-layered ferromagnetic layers and (N−1)-layered non-magnetic layers interposed therebetween, and a spacer layer interposed between the free layer and the fixed layer, (N is an integer of equal to or more than three), and the synthetic antiferromagnet structure being designed to reverse the magnetization of one ferromagnetic layer among the N-layered ferromagnetic layers more easily than magnetizations of the other ferromagnetic layers in a state in which magnetizations of the N-layered ferromagnetic layers are directed in the same direction. The MRAM operational method is composed of the steps of:

feeding a first write current to a first selected interconnection selected from among the plurality of the first interconnections; and feeding a second write current to a second selected interconnection selected from among the plurality of the second interconnections. The first and second currents are provided to generate a resultant magnetic field having a strength enough to align, substantially in the same direction, magnetizations of the N-layered ferromagnetic layers within the synthetic antiferromagnet structure of the memory cell at which the first and second selected interconnections are crossed. The MRAM operation method mentioned above is capable of writing data without depending on the initial state of the magnetizations of the ferromagnetic layers by using the magnetization direction control method, while the net magnetic moment of the free layer is adjusted to be zero. In addition, the MRAM is capable of improving the selectivity of the memory cells by employing the synthetic antiferromagnet structure as the free layer.

As mentioned above, the present invention enables to control the magnetization directions of ferromagnetic layers within a synthetic antiferromagnet structure without using antiferromagnetic material.

The present invention also enables to direct magnetizations of ferromagnetic layers within a synthetic antiferromagnet structure to desired directions without depending on the initial state of the magnetizations of the ferromagnetic layers of the synthetic antiferromagnet structure.

The present invention further enables to direct magnetizations of ferromagnetic layers of a synthetic antiferromagnet structure to desired directions while the net magnetic moment of the synthetic antiferromagnet structure is kept to be zero.

Moreover, the present invention achieves providing an MRAM with high selectivity of the memory cells in the write operation.

BRIEF DESCRIPTION OF DRAWINGS

FIG. 8A is a cross sectional view showing a synthetic antiferromagnet structure applied in a first embodiment of a magnetization direction control method of the present invention;

FIG. 9A is a diagram showing a process in which magnetizations of respective ferromagnetic layers are aligned in a direction of an external magnetic field $H_E$ in the first embodiment;

FIG. 9B is a diagram showing the process in which the magnetizations of the respective ferromagnetic layers are aligned in the direction of the external magnetic field $H_E$ in the first embodiment;

FIG. 9C is a diagram showing the process in which magnetizations of some of the ferromagnetic layers are reversed to a direction opposite to the external magnetic field $H_E$ in the first embodiment;

FIG. 18 is a plane view of the MRAM memory cell including the synthetic antiferromagnet structure as the free layer in which the magnetization direction control method of the present invention is applied;

BEST MODE FOR CARRYING OUT THE INVENTION

First Embodiment

Figure 1:
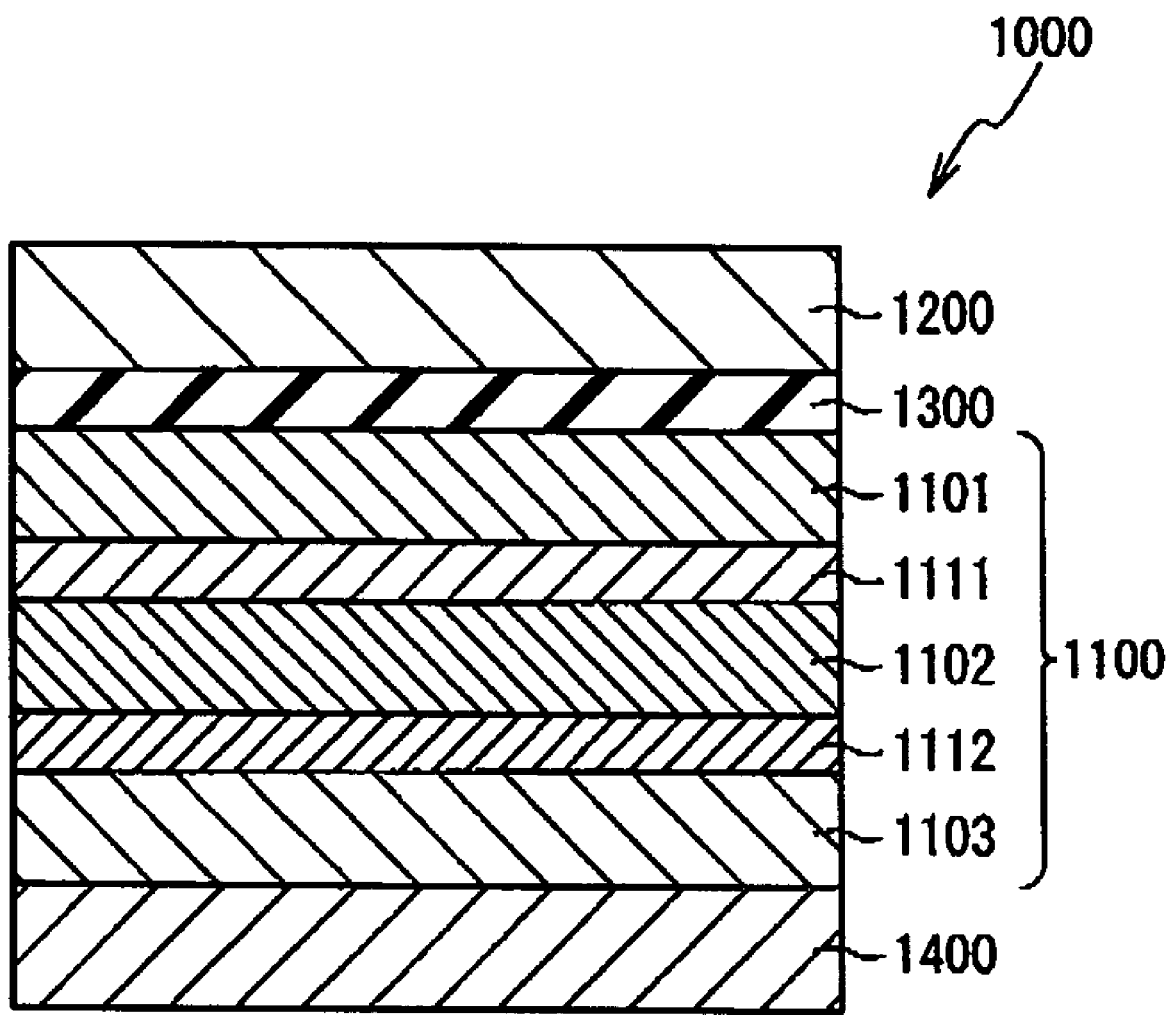
FIG. 1 shows the structure of a conventional MRAM memory cell using a synthetic antiferromagnet structure as a fixed layer.
Figure 2:
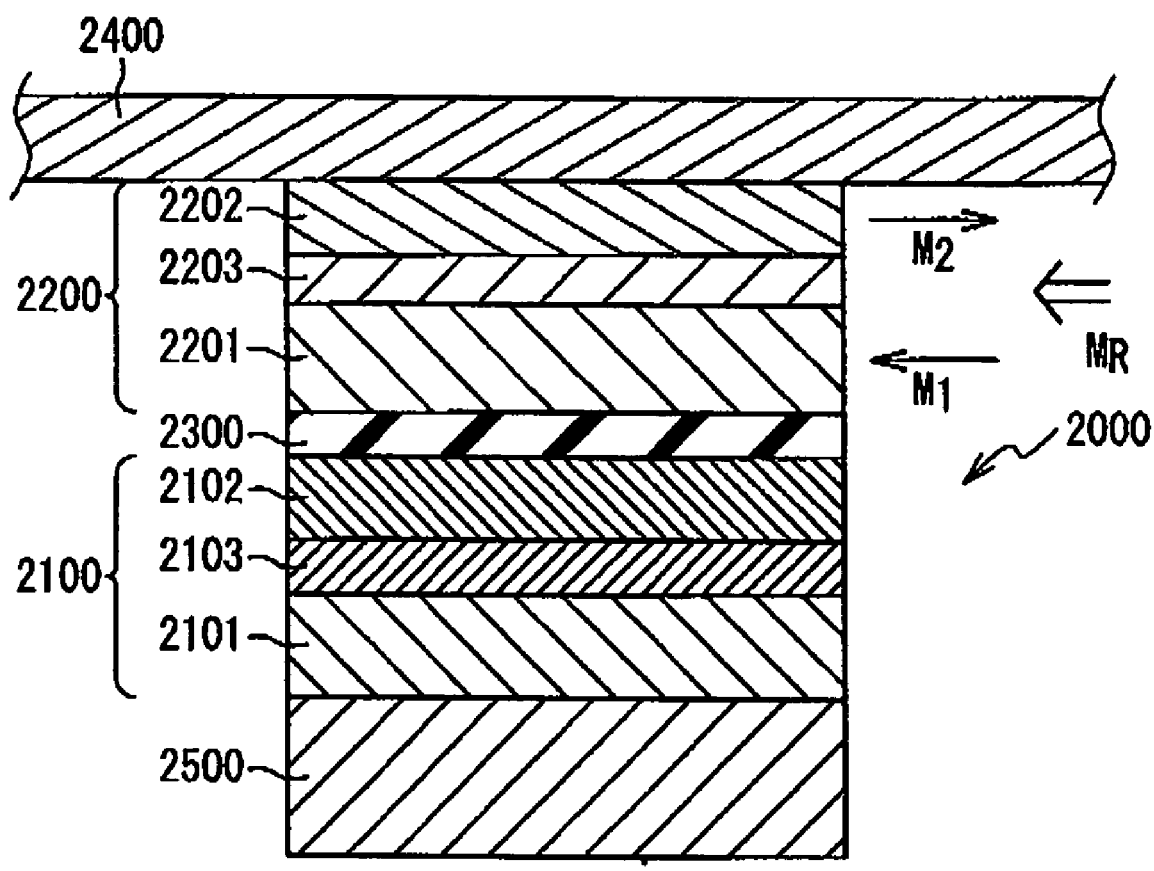
FIG. 2 is a cross sectional view showing the structure of a conventional MRAM memory array.
Figure 3:
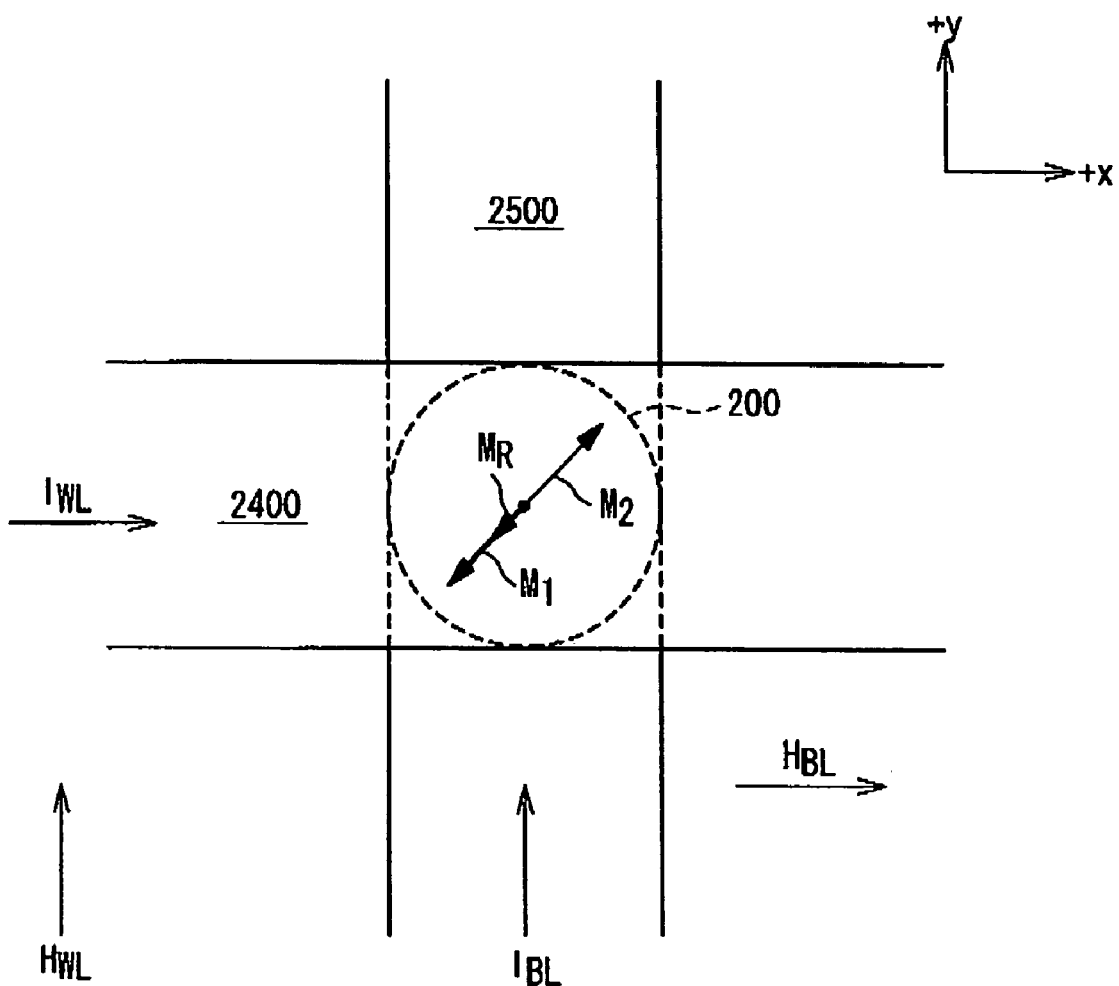
FIG. 3 is a plane view showing the structure of the conventional MRAM memory array.
Figure 4:
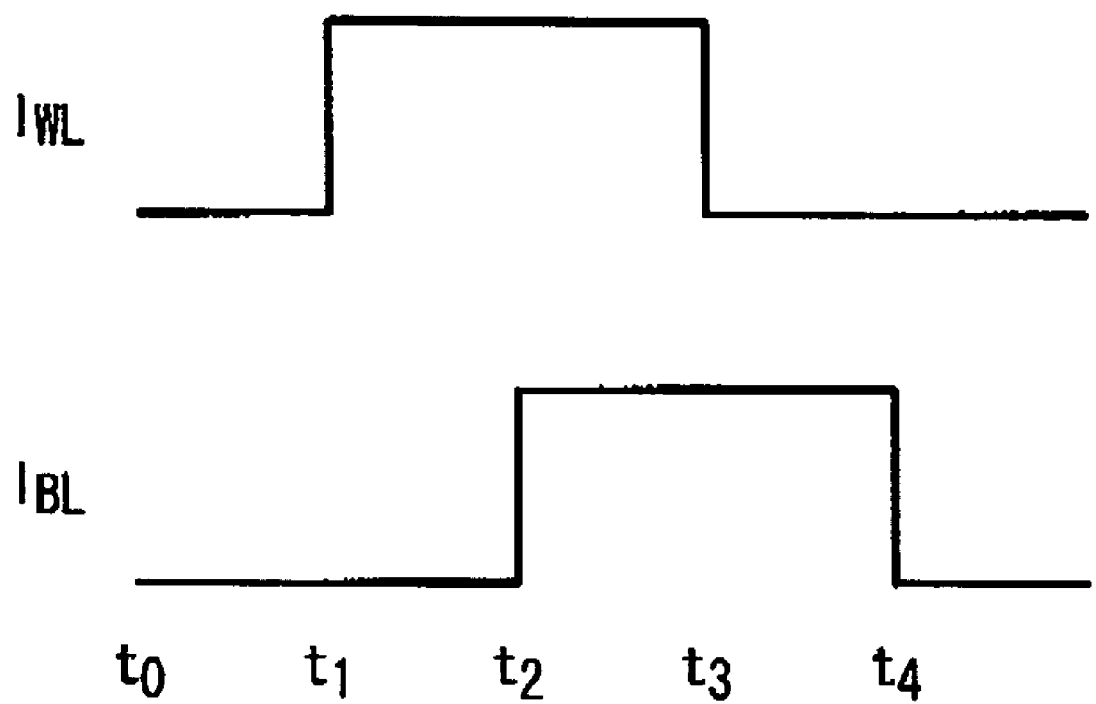
FIG. 4 is a timing-chart showing the conventional toggle writing.
Figure 5:
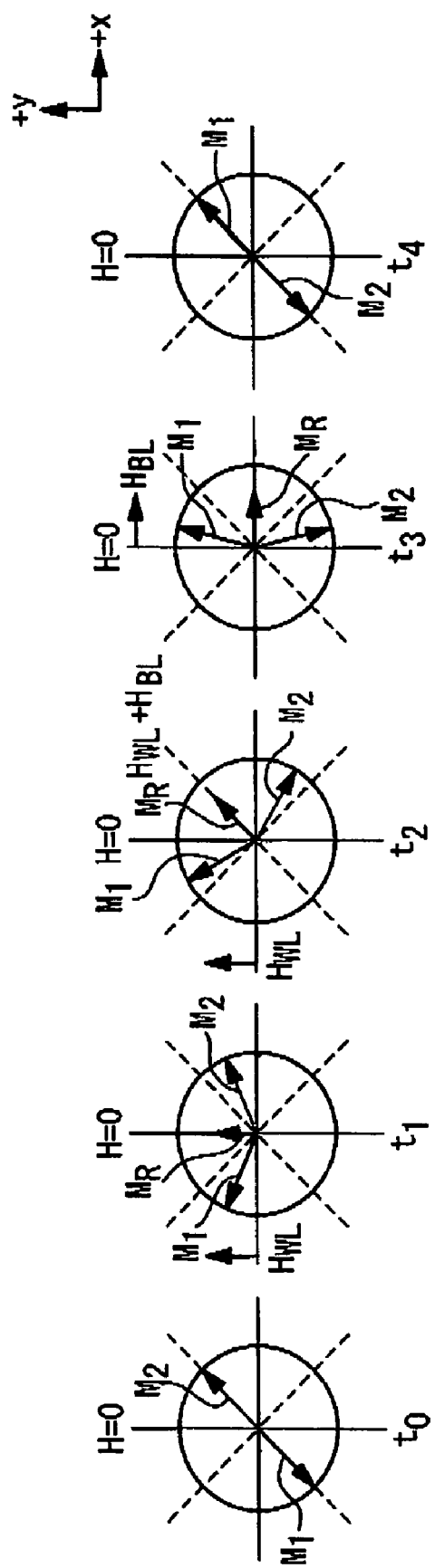
FIG. 5 is a diagram showing changes of magnetization directions of ferromagnetic layers in the conventional toggle writing.
Figure 6:
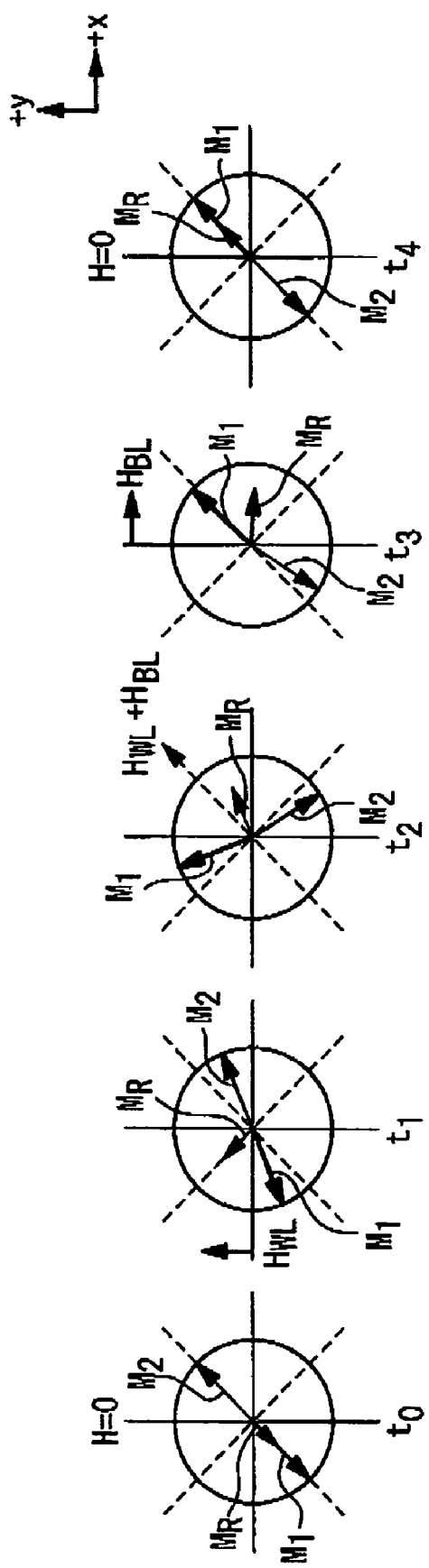
FIG. 6 is a diagram showing changes of magnetization directions of the ferromagnetic layer in the conventional direct writing.
Figure 7:
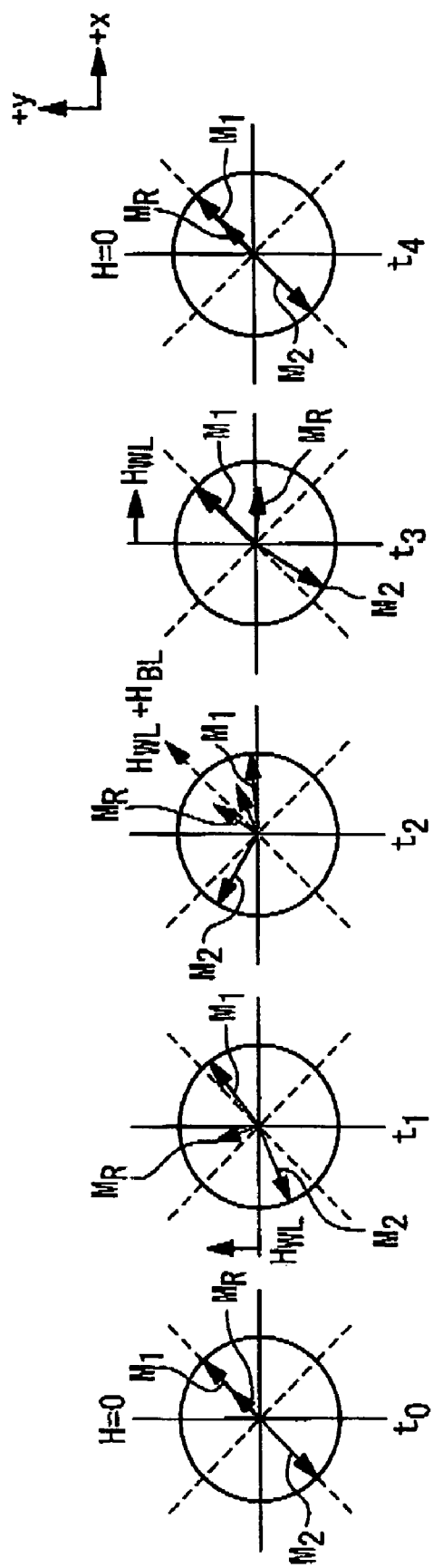
FIG. 7 is a diagram showing changes of magnetization directions of the ferromagnetic layers in the conventional direct writing.

Referring to FIG. 8A, in a first embodiment of a magnetization direction control method according to the present invention, an MRAM synthetic antiferromagnet structure 10A is composed of first to third ferromagnetic layers 11 to 13, and first and second non-magnetic layers 21 and 22. The first to third ferromagnetic layers 11 to 13 are formed of ferromagnetic material, typically Co, Fe, Ni or an alloy thereof. The first to third ferromagnetic layers 11 to 13 are formed to have a long shape in the +X direction, thereby easy axes thereof are directed in parallel to the +X direction. The first non-magnetic layer 21 is interposed between the first and second ferromagnetic layers 11 and 12, and the second non-magnetic layer 22 is interposed between the second and third ferromagnetic layers 12 and 13. The first and second non-magnetic layers 21 and 22 are formed of conductive non-magnetic material, typically Ru. Each of the first and second non-magnetic layers 21 and 22 has a film thickness so as to antiferromagnetically couple the adjacent ferromagnetic layers to each other.

The first ferromagnetic layer 11 is formed so that the product of the film thickness and the magnetization magnitude thereof is smaller than those of other ferromagnetic layers: the second ferromagnetic layer 12 and the third ferromagnetic layer 13. That is, the synthetic antiferromagnet structure 10A is formed so as to satisfy the following formulas (1a) and (1b):

$$M_1 \cdot t_1 < M_2 \cdot t_2, \quad (1a)$$

$$M_1 \cdot t_1 < M_3 \cdot t_3, \quad (1b)$$

where $M_1$, $M_2$, and $M_3$ indicate the magnetization magnitudes of the first, second and third ferromagnetic layers 11, 12 and 13, respectively, and $t_1$, $t_2$, and $t_3$ indicate film thicknesses of the first, second and third ferromagnetic layers 11, 12 and 13, respectively.

The first to third ferromagnetic layers 11 to 13 are formed so that a sum of the products of the magnetization magnitudes and the film thicknesses of the odd-numbered ferromagnetic layers, that is, the first ferromagnetic layer 11 and the third ferromagnetic layer 13 is identical to the product of the magnetization magnitude and the film thickness of the even-numbered ferromagnetic layer; that is, the second ferromagnetic layer 12. In other words, the synthetic antiferromagnet structure 10A is formed to satisfy the following formula (2) in the magnetization magnitudes and the film thicknesses of the respective ferromagnetic layers:

$$M_1 \cdot t_1 + M_3 \cdot t_3 = M_2 \cdot t_2 \quad (2)$$

Therefore, the net magnetic moment of the synthetic antiferromagnet structure 10A is adjusted to be zero. As mentioned above, it is important that the net magnetic moment is zero in terms of preventing the synthetic antiferromagnet structure 10A from applying a magnetic field to other elements and thereby integrating the synthetic antiferromagnet structure 10A in MRAM memory cells.

In order to reduce the manufacture cost, it is preferable that the first to third ferromagnetic layers 11 to 13 are formed of the same material. In this case, the first to third ferromagnetic layers 11 to 13 are formed to satisfy the following formulas (1') and (2'):

$$t_1 < t_2, t_3 \quad (1')$$

$$t_1 + t_3 = t_2 \quad (2')$$

In this embodiment, the first to third ferromagnetic layers 11 to 13 are formed with the same material, and a film thickness ratio thereof is adjusted to be 0.5:2.0:1.5.

In this embodiment, the easiness of the magnetization reversal of the respective ferromagnetic layers is controlled by the products of the film thicknesses and the magnetization magnitudes of the respective ferromagnetic layers in a state in which the magnetizations of the ferromagnetic layers within the synthetic antiferromagnet structure are aligned in the same direction by the application of the external magnetic field, and thereby, the directions of magnetizations of the first to third ferromagnetic layers 11 to 13 with the external magnetic field removed are controlled. Specifically, the first ferromagnetic layer 11 is formed to have the smallest product of the film thickness and the magnetization magnitude thereof among the first to third ferromagnetic layers 11 to 13, thereby the directions of the magnetizations of the respective ferromagnetic layers with the external magnetic field removed are controlled. Referring to FIGS. 9A and 9B, a procedure to direct the magnetizations of the respective ferromagnetic layers within the synthetic antiferromagnet structure 10A to desired directions will be specifically described below. It should be noted that the directions to which the first ferromagnetic layers 11 and the third ferromagnetic layer 13 should be directed are assumed to be the −X direction in the following description, while the direction to which the second ferromagnetic layer 12 should be directed is assumed to be the +X direction.

As shown in FIGS. 9A and 9B, a large external magnetic field $H_E$ is first applied so as to direct the magnetizations of the respective first to third ferromagnetic layers 11 to 13 to the +X direction. It should be noted that the direction of the external magnetic field $H_E$ is opposite to the direction to which the magnetization of the first ferromagnetic layer 11, which has the smallest product of the film thickness and the magnetization magnitude, should be directed. There are two possible initial states of the directions of magnetizations of the first to the third ferromagnetic layers 11 to 13; FIG. 9A shows a state in which the magnetizations of the first and third ferromagnetic layers 11 and 13 are initially directed to the −X direction, while the magnetizations of the second ferromagnetic layer 12 are directed to the +X direction. FIG. 9B shows a state in which the magnetizations of the first to third ferromagnetic layers 11 to 13 are directed opposite to those shown in FIG. 9A. The process of directing the magnetizations of the first to third ferromagnetic layers 11 to 13 to the +X direction depends on the states of the first to third ferromagnetic layers 11 to 13. For the case of FIG. 9A, the magnetization of the third ferromagnetic layer 13 is reversed to the +X direction when the external magnetic field $H_E$ is increased up to a flop magnetic field $H_{f2}$, while the magnetization of the first ferromagnetic layer 13 is also reversed to the +X direction when the external magnetic field $H_E$ is increased up to a flop magnetic field $H_{f4}$. As a result, magnetizations of the first to third ferromagnetic layers 11 to 13 are all directed in the +X direction. For the case of FIG. 9B, the magnetization of the second ferromagnetic layer 12 is reversed to the +X direction when the external magnetic field is increased up to a flop magnetic field $H_{f5}$, and magnetizations of the first to third ferromagnetic layers 11 to 13 are all aligned in the +X direction.

The external magnetic field $H_E$ is increased to largely exceed the flop magnetic field $H_{f4}$ and $H_{f5}$. This is important to align magnetizations of the first to third ferromagnetic layers 11 to 13 in the same direction. As shown in FIGS. 9A and 9B, magnetizations are not completely saturated by an external magnetic field slightly exceeding the flop magnetic fields $H_{f4}$ and $H_{f5}$ due to an antiferromagnetic coupling among the first to third ferromagnetic layers 11 to 13; in other word, the magnetizations are not completely directed to the easy axis direction (+X direction) (refer to FIG. 10A).

After the magnetization directions of the first to third ferromagnetic layers 11 to 13 are all directed in the +X direction, the external magnetic fields $H_E$ is decreased with the magnetization directions kept in the easy axis direction (+X direction). When the external magnetic fields $H_E$ is decreased to the flop magnetic fields $H_{f3}$, the magnetization of the first ferromagnetic layer 11, which has the smallest product of the film thickness and the magnetizations, is reversed first as shown in FIG. 9C. This is because the magnetic moment of the first ferromagnetic layer 11 is the smallest. When the external magnetic field $H_E$ is decreased, the magnetostatic energy of the first to third ferromagnetic layers 11 to 13 decreases. In the decrease of the magnetostatic energy, the magnetostatic energy of the first ferromagnetic layer 11, which has the smallest magnetic moment, is firstly balanced with the antiferromagnetic coupling energy at a certain external magnetic field $H_E$ (that is a flop magnetic field $H_{f3}$). At this external magnetic field $H_E$, the magnetizations of the second ferromagnetic layer 12 and the third ferromagnetic layer 13 are more stabilized with the magnetizations thereof directed to the external magnetic field $H_E$ in terms of energy. Therefore, the magnetization of only the first ferromagnetic layer 11 is reversed.

When the external magnetic field is further decreased, the magnetization of the third ferromagnetic layer 13, which is not adjacent to the first ferromagnetic layer 11, is reversed to the −X direction. This is because the magnetization direction of the second ferromagnetic layer 12 adjacent to the first ferromagnetic layer 11 is stabilized by the antiferromagnetic coupling with the magnetization of the first ferromagnetic layer 11 due to the magnetization reversal of the first ferromagnetic layer 11. The magnetization of the third ferromagnetic layer 13 is reversed when the external magnetic field $H_E$ is decreased down to a flop magnetic field $H_{f1}$, which is smaller than the flop magnetic field $H_{f3}$.

As mentioned above, the magnetization direction control method in the present embodiment achieves directing the magnetizations the respective ferromagnetic layers to desired direction without using the antiferromagnetic layers. In addition, according to the magnetization direction control method in the present embodiment, the final magnetization directions of the respective ferromagnetic layers do not depend on the initial magnetization directions thereof. This eliminates the necessity for performing a read operation before a write operation. Further, the magnetization direction control method in the present embodiment allows using a synthetic antiferromagnet structure configured to have a net magnetic moment of substantially zero.

Figure 10A:
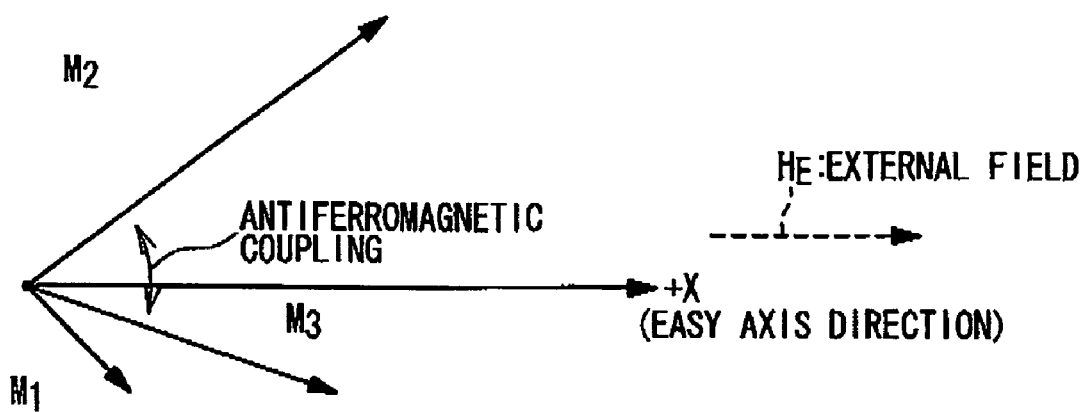
FIG. 10A is a diagram showing a relationship between the external magnetic field $H_E$ and magnetizations $M_1$, $M_2$ and $M_3$ of the respective ferromagnetic layers when the external magnetic field $H_E$ is in parallel with the easy axis.
Figure 10B:
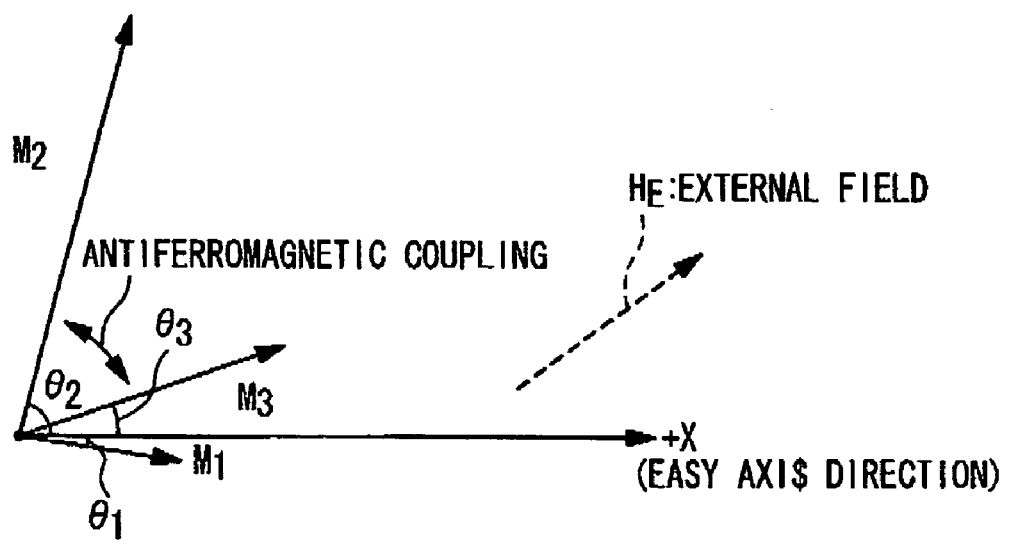
FIG. 10B is a diagram showing a relationship between the external magnetic field $H_E$ and the magnetizations $M_1$, $M_2$ and $M_3$ of the ferromagnetic layers when the external magnetic field $H_E$ is not in parallel with the easy axis.

It is important to keep the direction of the external magnetic field $H_E$ in the easy axis while the external magnetic field $H_E$ is decreased. FIGS. 10A and 10B are conceptual diagrams to explain the reason. As shown in FIG. 10A, the magnetization $M_1$ of the first ferromagnetic layer 11 is initially reversed as desired in the decrease of the external magnetic field $H_E$ as long as the external magnetic field $H_E$ is directed to the easy axis direction (+X direction). Since the first ferromagnetic layer 11 has the smallest magnetic moment, the magnetization direction of the first ferromagnetic layer 11 has relatively the largest influence of the antiferromagnetic coupling exerting on the adjacent ferromagnetic layers. Therefore, the angle $\theta_1$ of the magnetization $M_1$ of the first ferromagnetic layer 11 to the external magnetic field $H_E$ is larger than the angle $\theta_2$ of the magnetization $M_2$ of the second ferromagnetic layer 12 to the external magnetic field $H_E$ and the angle $\theta_3$ of the magnetization $M_3$ of the third ferromagnetic layer 12 to the external magnetic field $H_E$. When the direction of the external magnetic field $H_E$ is equal to the direction of the easy axis, it means that the angle $\theta_1$ of the magnetization $M_1$ of the first ferromagnetic layer 11 to the easy axis is the largest. Accordingly, the magnetization $M_1$ of the first ferromagnetic layer 11 is reversed first.

On the other hand, this may not apply to the case when the external magnetic field $H_E$ is directed obliquely as shown in FIG. 10B. This is because, a possibility is arisen in which the angle $\theta_2$ of the magnetization $M_2$ of the second ferromagnetic layer 12 to the easy axis is the largest among the first to third ferromagnetic layers 11 to 13 as shown in FIG. 10B, when the external magnetic field $H_E$ is directed obliquely. When the angle $\theta_2$ of the magnetization $M_2$ of the second ferromagnetic layer 12 to the easy axis is the largest among the first to third ferromagnetic layers 11 to 13, the magnetization $M_2$ of the second ferromagnetic layer 12 is reversed first of all. This results in that the magnetizations of the first to third ferromagnetic layers 11 to 13 are not directed to desired directions. As thus described, keeping the external magnetic field $H_E$ in the easy axis direction during decreasing the external magnetic field $H_E$ is important for directing the magnetizations of the first to third ferromagnetic layers 11 to 13 to the desired directions.

The attention should be paid to the fact that it is of significance that the ferromagnetic layer having the smallest product of the film thickness and magnetization magnitude is positioned as an odd-numbered ferromagnetic layer in the synthetic antiferromagnet structure 10A in this embodiment, in which the number of ferromagnetic material included in the synthetic antiferromagnet structure 10A is three. It is not preferable that the synthetic antiferromagnet structure 10A is configured so that the second ferromagnetic layer 12 has the smallest product of the film thickness and the magnetization magnitude in the synthetic antiferromagnet structure 10A. It is certainly possible to direct the magnetizations of the respective ferromagnetic layers to desired directions by selecting the second ferromagnetic layer 12 as a ferromagnetic layer having the smallest product of the film thickness and the magnetization magnitude thereof; however, the selection of the second ferromagnetic layer 12 as the ferromagnetic layer having the smallest product of the film thickness and the magnetization magnitude thereof makes it impossible for the synthetic antiferromagnet structure 10A to have a total magnetic moment of zero.

The concept of this embodiment is applicable to a synthetic antiferromagnet structure including ferromagnetic layers of equal to or more than 4. The control of the product of the film thickness and the magnetization magnitudes of the ferromagnetic layers allows reversing the magnetizations of the ferromagnetic layers in a desired order and to direct the magnetizations of the ferromagnetic layers to desired directions in the synthetic antiferromagnet structure.

When the number of the ferromagnetic layers is four, it is preferable to position the ferromagnetic layer having the smallest product of the film thickness and the magnetization magnitude at an intermediate position of the synthetic antiferromagnet structure, that is, at the second or the third position. This is because the magnetization directions of the ferromagnetic layers are all decided by the first magnetization reversal of the ferromagnetic layer having the smallest product of the film thickness and the magnetization magnitude, which is located at the intermediate position of the synthetic antiferromagnet structure. It should be noted that the first magnetization reversal of the ferromagnetic layer influences two ferromagnetic layers adjacent to the ferromagnetic layer firstly experiencing the magnetization reversal. When the ferromagnetic layer positioned at the top (at the first position) has the lowest product of the film thickness and the magnetization magnitude, the magnetization directions of the ferromagnetic layers positioned at the third and fourth positions are uncertain. The same applies to the case when the ferromagnetic layer having the smallest product of the film thickness and the magnetization magnitude is positioned at the bottom.

Figure 8B:
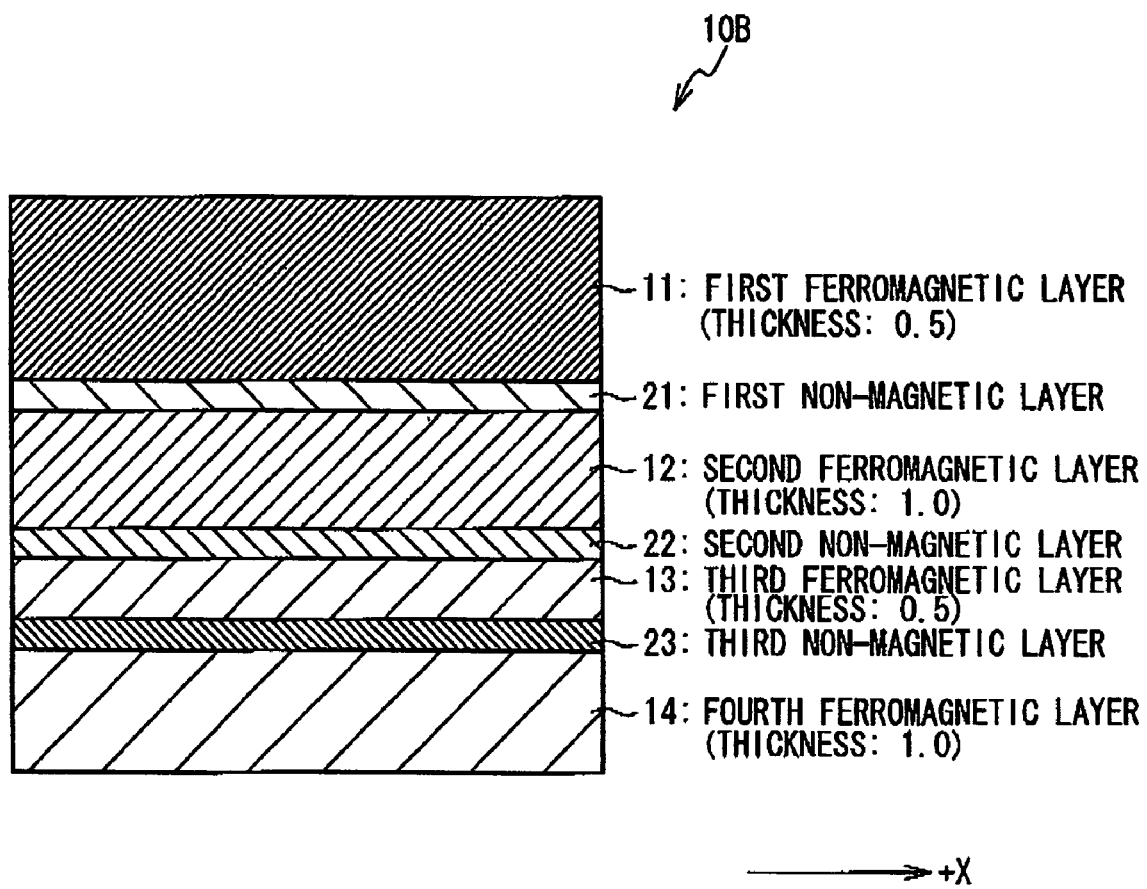
FIG. 8B is a cross sectional view showing another synthetic antiferromagnet structure applied in the first embodiment of the magnetization direction control method of the present invention.

For example, a synthetic antiferromagnet structure 10B including four ferromagnetic layers as shown in FIG. 8B will be considered in the following. The synthetic antiferromagnet structure 10B includes first to fourth ferromagnetic layers 11 to 14, and first to third non-magnetic layers 21 to 23 interposed therebetween. The first to fourth ferromagnetic layers 11 to 14 are composed of the same material, and the magnetization magnitudes thereof are substantially the same. Furthermore, the synthetic antiferromagnet structure 10B is also composed so that the film thickness ratio of the first to fourth ferromagnetic layers 11 to 14 is 1.5:1.0:0.5:1.0. The third ferromagnetic layer 13 has the smallest product of the film thickness and the magnetization magnitude thereof among the first to fourth ferromagnetic layers 11 to 14, and the net magnetic moment of the synthetic antiferromagnet structure 10B is zero.

In the synthetic antiferromagnet structure 10B thus designed, the magnetizations of the first ferromagnetic layer 11 and the third ferromagnetic layer 13 are selectively reversed so as to direct the magnetizations of the respective ferromagnetic layers to desired directions, by firstly reversing the magnetization of the third ferromagnetic layer. The magnetization of the third ferromagnetic layer 13 is first reversed in the process of decreasing the external magnetic field $H_E$, since the third ferromagnetic layer 13 has the smallest product of the film thickness and the magnetization magnitude thereof among the first to fourth ferromagnetic layers 11 to 14. The first magnetization reversal of the third ferromagnetic layer 13 causes the magnetization directions of the remaining ferromagnetic layers to be fixed. When the magnetization of the third ferromagnetic layer 13 is reversed, the magnetization directions of the second ferromagnetic layer 12 and the fourth ferromagnetic layer 14, which are adjacent to the third ferromagnetic layer 13, are stabilized by the antiferromagnetic coupling. Accordingly, it is the magnetization of the first ferromagnetic layer 11 that is next reversed when the external magnetic field $H_E$ is further decreased. As mentioned above, the magnetizations of the first ferromagnetic layer 11 and the third ferromagnetic layer 13 are directed to the direction opposite to the external magnetic field $H_E$, while the magnetizations of the second ferromagnetic layer 12 and the fourth ferromagnetic layer 14 are directed to the same direction with the external magnetic field $H_E$, as desired.

Figure 8C:
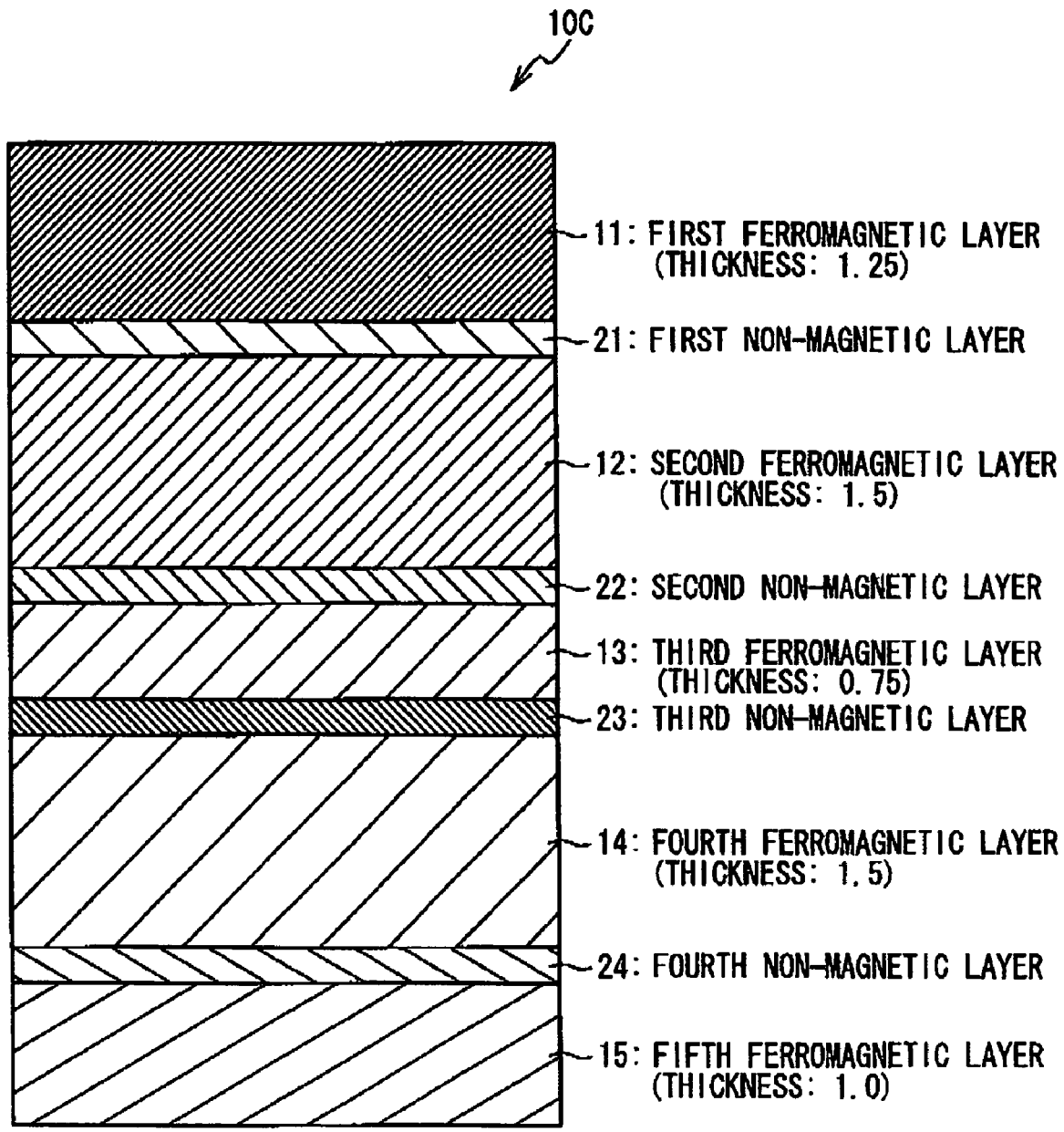
FIG. 8C is a cross sectional view showing still another synthetic antiferromagnet structure applied in the first embodiment of the magnetization direction control method of the present invention.

Similarly, as shown in FIG. 8C, it is preferable that the third ferromagnetic layer has the smallest product of the film thickness and the magnetization magnitude thereof when the number of the ferromagnetic layers is five. In the example shown FIG. 8C, a synthetic antiferromagnet structure 10C includes first to five ferromagnetic layers 11 to 15, and first to fourth non-magnetic layers 21 to 24 interposed therebetween. The synthetic antiferromagnet structure 10C is composed so that the third ferromagnetic layer 13 has the smallest product of the film thickness and the magnitude of the magnification thereof among the first to fifth ferromagnetic layers 11 to 15. Therefore, the magnetization of the third ferromagnetic layer 13 is first reversed in the process of decreasing the external magnetic field $H_E$. It would be easily understood that the magnetization directions of the remaining ferromagnetic layers are fixed when the magnetization of the third ferromagnetic layer 13 is firstly reversed.

In some cases, magnetization directions of some of the ferromagnetic layers may be uncertain after the first magnetization reversal of the ferromagnetic layer. This applies to the following three cases:

(a) A case when the number of ferromagnetic layers is equal to or more than six.

(b) A case when the number of ferromagnetic layers is four and the ferromagnetic layer exhibiting the first magnetization reversal is positioned at the top or the bottom.

(c) A case when the number of ferromagnetic layers is five and the ferromagnetic layer exhibiting the first magnetization reversal is not the third ferromagnetic layer.

In such cases, it is necessary to appropriately determine the products of the film thicknesses and the magnetization magnitudes of the respective ferromagnetic layers so that the magnetizations of only the odd-numbered ferromagnetic layers are reversed or magnetizations of only the even-numbered ferromagnetic layers are reversed.

In order to achieve selective reversal of the magnetizations of the odd-numbered ferromagnetic layers in the process of decreasing the external magnetic field $H_E$, the synthetic antiferromagnet structure is configured as follows:

(a) The ferromagnetic layer having the smallest product of the film thickness and the magnetization magnitude thereof is selected from among the odd-numbered ferromagnetic layers, and (b) the product of the film thickness and the magnetization magnitude of any odd-numbered ferromagnetic layer is smaller than the products of the film thicknesses and the magnetization magnitudes of all the even-numbered ferromagnetic layers.

The synthetic antiferromagnet structure thus configured allows exclusively reversing the magnetizations of the odd-numbered ferromagnetic layers in the process of decreasing the external magnetic field so that the magnetizations of the respective ferromagnetic layers are directed to desired direction. For example, a synthetic antiferromagnet structure 10D shown in FIG. 8D will be considered in the following. In the example shown in FIG. 8D, the synthetic antiferromagnet structure 10D includes first to fifth ferromagnetic layers 11 to 15, and first to fourth non-magnetic layers 21 to 24 interposed therebetween. The first to fifth ferromagnetic layers 11 to 15 are composed of the same material and the magnetization magnitudes thereof are substantially the same. The synthetic antiferromagnet structure 10D is also composed so that the film thickness ratio of the first to fifth ferromagnetic layers 11 to 15 is 0.75:1.5:1.25:1.5:1.0. In this synthetic antiferromagnet structure 10D, the first ferromagnetic layer 11, which has the smallest film thickness and exhibits the first magnetization reversal, is positioned at the top, and therefore magnetization directions of the remaining ferromagnetic layers are not fixed by the first magnetization reversal. However, the fact that the synthetic antiferromagnet structure 10D satisfies the above-mentioned conditions (a) and (b) allows selectively reversing the magnetizations of only the odd-numbered ferromagnetic layers so that the magnetizations of the respective ferromagnetic layers are directed to desired directions.

When the synthetic antiferromagnet structure is configured so as to satisfy the above-mentioned conditions (a) and (b), it is preferable that the number of ferromagnetic layers is odd. Such structure allows selectively reversing the magnetizations of the odd-numbered ferromagnetic layers while the net magnetic moment of the synthetic antiferromagnet structure is adjusted to be zero. When the number of ferromagnetic layers is odd, the number of the odd-numbered ferromagnetic layers is more than the number of even-numbered ferromagnetic layers by one. This implies that the net magnetic moment of the synthetic antiferromagnet structures can be adjusted to zero even when the product of the film thickness and the magnetization magnitude of any odd-numbered ferromagnetic layer is smaller than the product of the film thickness and the magnetization magnitude of any even-numbered ferromagnetic layer.

Figure 8D:
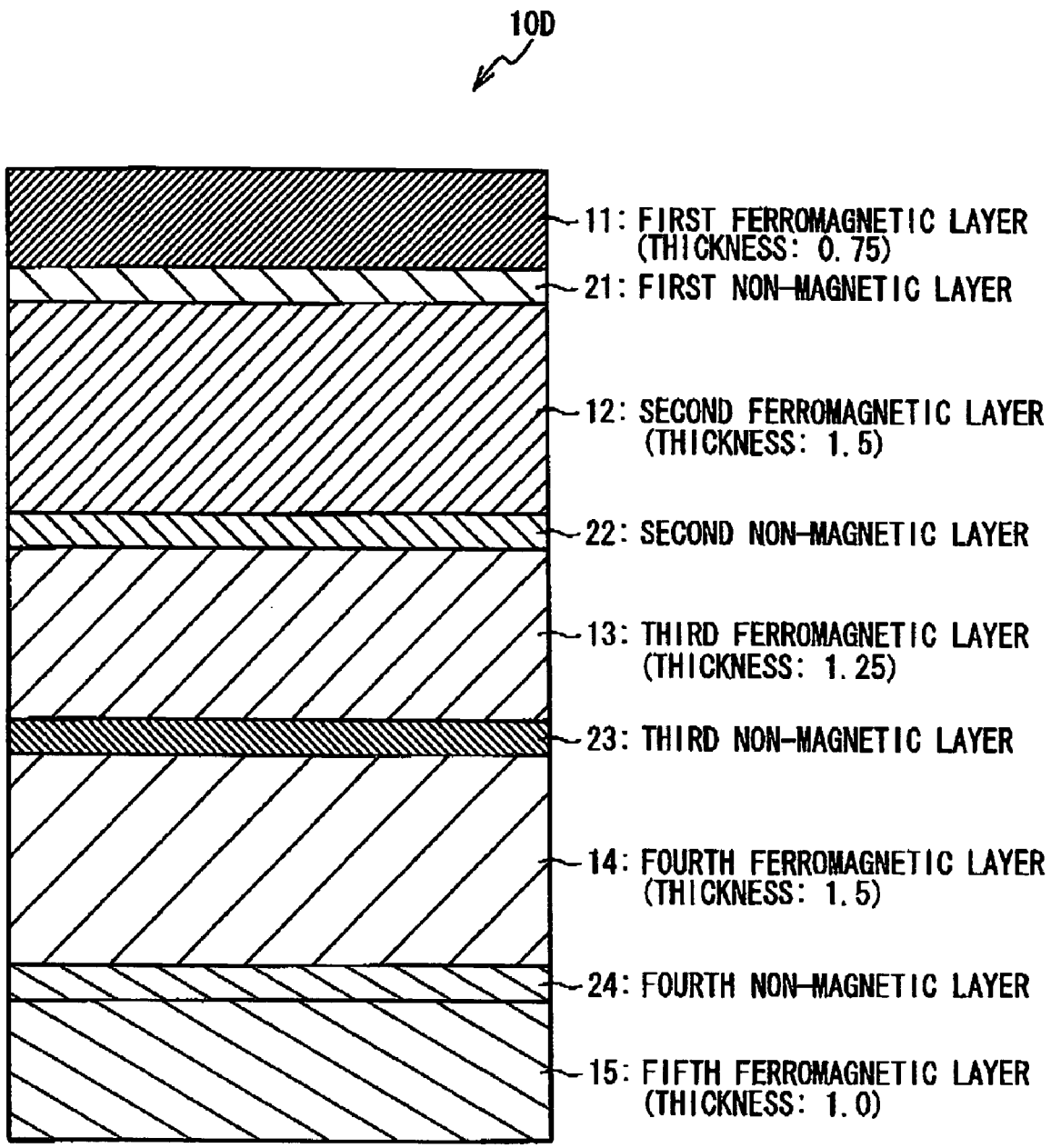
FIG. 8D is a cross sectional view showing still another synthetic antiferromagnet structure applied in the first embodiment of the magnetization direction control method of the present invention.

The structure shown in FIG. 8D is one of the structures which satisfy the above-mentioned conditions (a) and (b), including an odd number of ferromagnetic layers. In the structure shown in FIG. 8D, the number of the ferromagnetic layers is odd, and the film thickness ratio of the first to fifth ferromagnetic layers is 0.75:1.5:1.25:1.5:1.0. That is, the sum of the film thicknesses of the odd-numbered ferromagnetic layers, including the first, third and fifth ferromagnetic layers 11, 13 and 15 is the same as the sum of the film thicknesses of the even-numbered ferromagnetic layers, including the second and fourth ferromagnetic layers 12 and 14, and the net magnetic moment of the synthetic antiferromagnet structure 10D is adjusted to zero.

On the other hand, in order to achieve selective reversal of the magnetizations of the even-numbered ferromagnetic layers in the process of decreasing the external magnetic field $H_E$ the synthetic antiferromagnet structure is configured as follows;

(a') the ferromagnetic layer having the smallest product of the film thickness and the magnetization magnitude thereof is selected among the even-numbered ferromagnetic layers, and;

(b') The product of the film thickness and the magnetization magnitude of any even-numbered ferromagnetic layer is smaller than the products of the film thicknesses and the magnetization magnitudes of all the odd-numbered ferromagnetic layers.

This allows selectively reversing the magnetizations of only the even-numbered ferromagnetic layers so that the magnetizations of the respective ferromagnetic layers are directed to desired direction in the process of decreasing the external magnetic field.

Second Embodiment

Figure 11A:
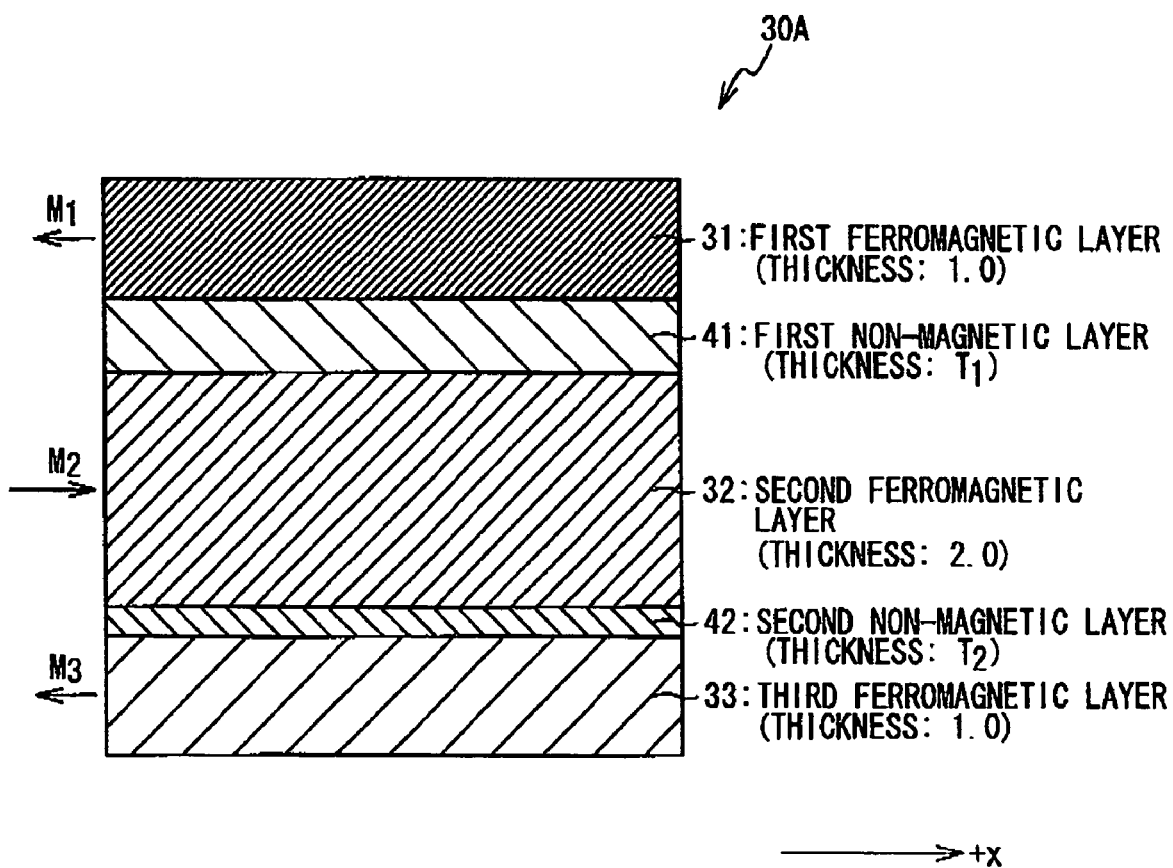
FIG. 11A is a cross sectional view showing a synthetic antiferromagnet structure applied in a second embodiment of the magnetization direction control method of the present invention.
Figure 12:
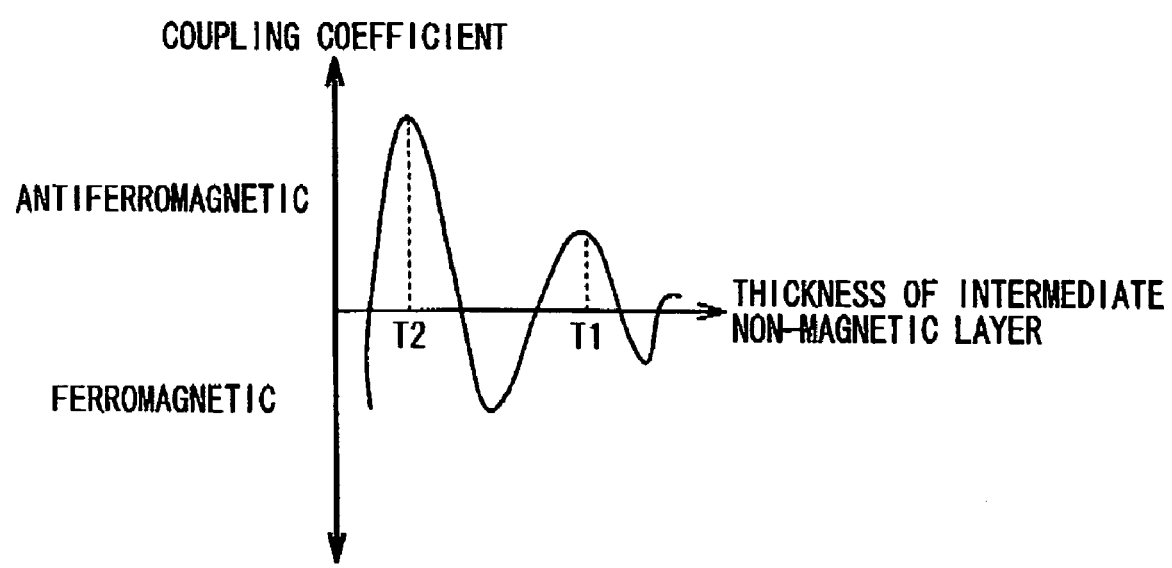
FIG. 12 is a graph showing the change of the coupling coefficient of an antiferromagnetic coupling depending on the film thickness of a non-magnetic layer.

FIG. 11A is a cross-sectional view showing a structure of an MRAM synthetic antiferromagnet structure 30A in a second embodiment of the present invention. In this embodiment, the order of reversing magnetizations of ferromagnetic layers during decreasing the external magnetic field layer is controlled by the strength of antiferromagnetic coupling between the adjacent two ferromagnetic layers. The strength of the antiferromagnetic coupling is controlled by the film thicknesses of non-magnetic layers interposed therebetween. As shown in FIG. 12, it is well-known to those skilled in the art that the strength of the antiferromagnetic coupling between the adjacent ferromagnetic layers depends on the film thickness of the non-magnetic layers interposed therebetween.

Specifically, as shown in FIG. 11A, the synthetic antiferromagnet structure 30A in this embodiment includes first to third ferromagnetic layers 31 to 33, and first and second non-magnetic layers 41 and 42. Similarly to the first embodiment, the first to third ferromagnetic layers 31 to 33 are formed of ferromagnetic material, typically Co, Fe, Ni and an alloy thereof, in which easy axes thereof are directed in parallel to the +X direction. The first non-magnetic layers 41 and 42 are formed of non-magnetic material, typically Ru. The first non-magnetic layer 41 is interposed between the first ferromagnetic layers 31 and 32, while the second non-magnetic layer 42 is interposed between the second and third ferromagnetic layers 32 and 33.

The synthetic antiferromagnet structure 30A is formed so that the products of the film thicknesses and the magnetization magnitudes of the first ferromagnetic layer 31 and the third ferromagnetic layer 33 are smaller than that of the second ferromagnetic layer 32. This allows reversing the magnetizations of the first and third ferromagnetic layers 31 and 33 more easily than the magnetization of the second ferromagnetic layer 32 in decreasing the external magnetic field.

In addition, the synthetic antiferromagnet structure 30A is formed so that the sum of the products of the film thicknesses and the magnitudes of the magnetization of the first and third ferromagnetic layers 31 and 33 is equal to the product of the film thickness and the magnetization magnitude of the second ferromagnetic layer 32. This allows the net magnetic moment of the synthetic antiferromagnet structure 30A to be adjusted to zero.

More specifically, the first to third ferromagnetic layers 31 to 33 are formed of the same material, wherein the film thicknesses $t_1$ and $t_3$ of the first ferromagnetic layer 31 and the third ferromagnetic layer 33 are thinner than the film thickness $t_2$ of the second ferromagnetic layer 32 in this embodiment. In addition, the first and third ferromagnetic layers 31 and 33 are formed so that the sum of the film thicknesses $t_1$ and $t_3$ of the first and third ferromagnetic layers 31 and 33 is equal to the film thickness $t_2$ of the second ferromagnetic layer 32.

Differently from the first embodiment, the film thickness of the first ferromagnetic layer 31 is equal to that of the third ferromagnetic layer 33 in this embodiment; that is, the product of the film thickness and the magnetization magnitude of the first ferromagnetic layer 31 is equal to that of the third ferromagnetic layer 33, which implies that it is uncertain from the products of the film thicknesses and the magnetization magnitudes which of the first ferromagnetic layer 31 and the third ferromagnetic layer 33 exhibits the enhanced easiness of the magnetization reversal.

Instead, the synthetic antiferromagnet structure 30A in this embodiment is configured so that the antiferromagnetic coupling between the second and third ferromagnetic layers 32 and 33 is stronger than the antiferromagnetic coupling between the first and second ferromagnetic layers 31 and 32. In other words, the coupling coefficient of the antiferromagnetic coupling between the second and third ferromagnetic layers 32 and 33 across the second non-magnetic layer 42 is larger than that of the antiferromagnetic coupling between the first and second ferromagnetic layers 31 and 32 across the first non-magnetic layer 41. More specifically, the film thickness $T_2$ of the second non-magnetic layer 42 is adjusted to be the smallest film thickness out of the film thicknesses at which the coupling coefficient exhibits local maximum value, and the film thickness $T_1$ of the first non-magnetic layer 41 is adjusted to be the second smallest thickness (refer to FIG. 12). As a result, the magnetization of the third ferromagnetic layer 33 is reversed more easily in the decrease of the external magnetic field than the magnetization of the first ferromagnetic layer 31.

A detailed description will be made below for a procedure of directing the magnetizations of the respective ferromagnetic layers within the synthetic antiferromagnet structure 30A to desired directions. It should be noted that the following description assumes that the magnetizations of the first ferromagnetic layer 31 and the third ferromagnetic layer 33 are to be directed in the –X direction, while the magnetization of the second ferromagnetic layer 32 is to be directed in the +X direction.

First, an external magnetic field $H_E$ having a large magnitude is applied so as to direct the magnetizations of all the first to third ferromagnetic layers 11 to 13 in the +X direction. It should be noted that the direction of the external magnetic field $H_E$ is opposite to the direction to which the magnetization of the third ferromagnetic layer 33 is to be directed.

This is followed by decreasing the external magnetic field $H_E$. During the decrease of the external magnetic field $H_E$, the directions of the magnetizations of the first to third ferromagnetic layers 11 to 13 are kept in the easy axis direction (+X direction).

In the process of decreasing the external magnetic field $H_E$, the ferromagnetic layer whose magnetization is first reversed is determined by the magnitudes of the products of the film thicknesses and the magnetization magnitudes (that is the magnitudes of the magnetic moments), and the strengths of the antiferromagnetic couplings from adjacent ferromagnetic layers. In this embodiment, reversed first is the magnetization of the third ferromagnetic layer 33, which has a smaller product of the film thickness and the magnetization magnitude than that of the second ferromagnetic layer 32, and is subjected to the antiferromagnetic coupling stronger than that of the first ferromagnetic layer 31.

When the external magnetic field $H_E$ is further decreased, the magnetization of the third ferromagnetic layer 33, which is not adjacent to the first ferromagnetic layer 31, is reversed to the –X direction. This is because the magnetization reversal of the first ferromagnetic layer 31 causes the magnetization direction of the second ferromagnetic layer 32 which is adjacent to the first ferromagnetic layer 31 to be stabilized by the antiferromagnetic coupling with the first ferromagnetic layer 31.

In this embodiment, the above-mentioned method achieves directing the magnetizations of the first ferromagnetic layer 11 and the third ferromagnetic layer 13 to the –X direction, while directing the magnetization of the second ferromagnetic layer 12 to the +X direction as desired.

Figure 11B:
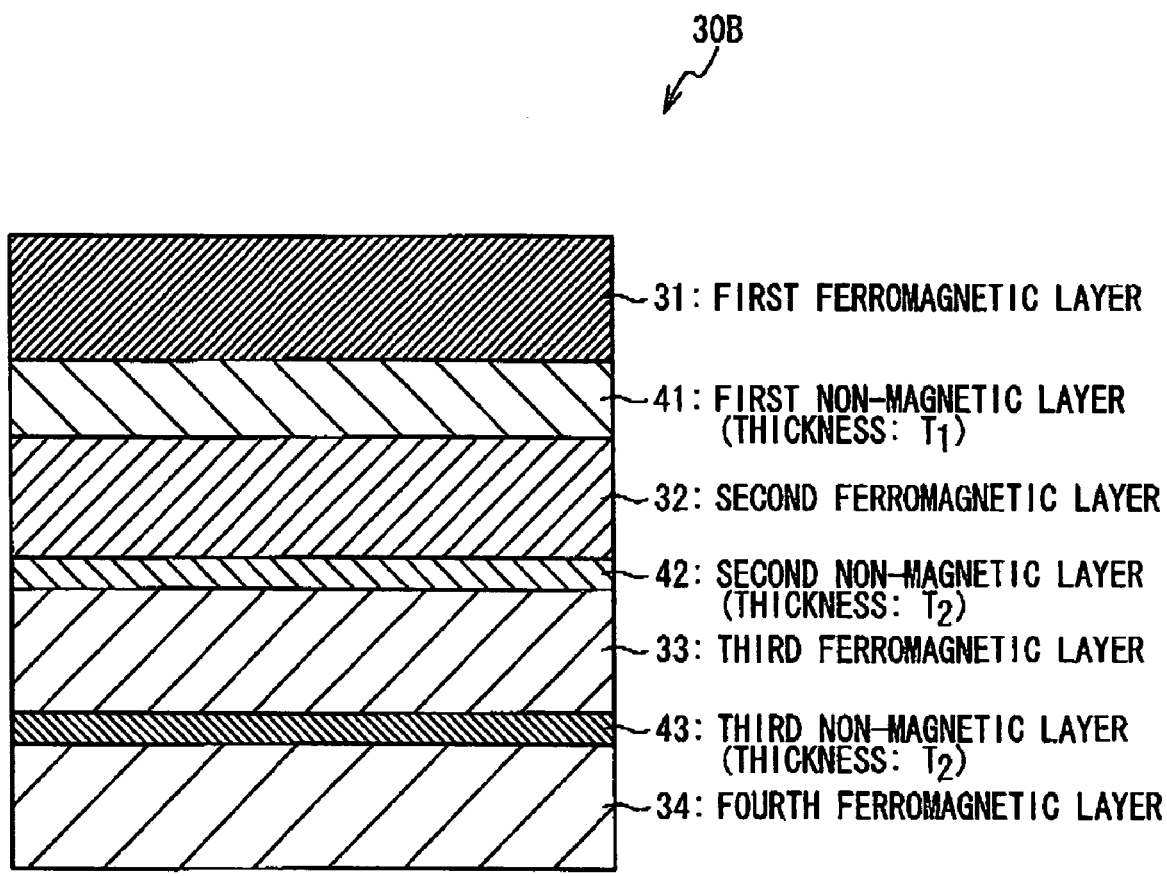
FIG. 11B is a cross sectional view showing another synthetic antiferromagnet structure applied in the second embodiment of the magnetization direction control method of the present invention.

The concept of this embodiment is applicable to the synthetic antiferromagnet structure including ferromagnetic layers of equal to or more than four. For example, the synthetic antiferromagnet structure 30B including four ferromagnetic layers is disclosed in FIG. 11B. The synthetic antiferromagnet structure 10B includes first to fourth ferromagnetic layers 31 to 34, and first to third non-magnetic layers 41 to 43 interposed therebetween.

In the synthetic antiferromagnet structure 30B, the first to fourth ferromagnetic layers 31 to 34 are formed of the same material with the same film thickness. This causes the sum of the products of the film thicknesses and the magnetization magnitudes of the odd-numbered ferromagnetic layers to be equal to that of the even-numbered ferromagnetic layers, so that the net magnetic moment of the synthetic antiferromagnet structure 10B is adjusted to zero.

In the synthetic antiferromagnet structure 30B as mentioned above, however, the order of reversing the magnetizations of the respective ferromagnetic layers in decreasing the external magnetic field $H_E$ is not decided by the products of the film thicknesses and the magnetization magnitudes.

Instead, the synthetic antiferromagnet structure 30B is configured so that the coupling coefficient of the antiferromagnetic coupling across the first non-magnetic layer 41 is smaller than the coupling coefficients of the antiferromagnetic couplings across the second and third non-magnetic layers 42 and 43. More specifically, the second and third non-magnetic layers 42 and 43 have the same film thickness $T_2$, and the film thickness $T_2$ is adjusted to be the smallest film thickness out of the film thicknesses at which the coupling coefficient exhibits local maximum value, while the film thickness $T_1$ of the first non-magnetic layer 41 is adjusted to be the second smallest.

Accordingly, the third ferromagnetic layer 33 firstly exhibits magnetization reversal in the process of decreasing the external magnetic field $H_E$. In detail, the structure of the synthetic antiferromagnet structure 30B causes the strength of the antiferromagnetic coupling to the third ferromagnetic layer 33 from the adjacent ferromagnetic layers to be greater than the strength of the antiferromagnetic coupling to the other ferromagnetic layers from the adjacent ferromagnetic layers. That is, the strength of the antiferromagnetic coupling to the third ferromagnetic layer 33 from the second and fourth ferromagnetic layers 32 and 34 is greater that any one of the followings:

(1) the strength of the antiferromagnetic coupling to the first ferromagnetic layer 31 from the second ferromagnetic layer 32;

(2) the strength of the antiferromagnetic coupling to the second ferromagnetic layer 32 from the first and third ferromagnetic layers 31 and 33, and;

(3) the strength of the antiferromagnetic coupling to the fourth ferromagnetic layer 34 from the third ferromagnetic layer 33.

As a result, the magnetization of the third ferromagnetic layer 33 is reversed more easily in the decrease of the external magnetic field $H_E$ than the magnetizations of the other ferromagnetic layers.

The first magnetization reversal of the third ferromagnetic layer 33, which is positioned at an intermediate position, automatically determines the magnetization directions of the remaining ferromagnetic layers. As explained in the first embodiment, the first magnetization reversal of an intermediate ferromagnetic layer in the process of decreasing the external magnetic field $H_E$ is of significance when the number of ferromagnetic layers is four. That is, the first magnetization reversal of the third ferromagnetic layer 33 causes the magnetization directions of all the remaining ferromagnetic layers to be destined. The magnetization reversal of the third ferromagnetic layer 13 stabilizes the magnetization directions of the second and fourth ferromagnetic layers 32 and 34, which are adjacent to the third ferromagnetic layer 33, with the antiferromagnetic coupling. Accordingly, the magnetization of the first ferromagnetic layer 31 is next reversed when the external magnetic field $H_E$ is further decreased. As mentioned above, the magnetizations of the first and third ferromagnetic layers 31 and 33 are directed to the direction opposite to the external magnetic field $H_E$, while the magnetizations of the second and fourth ferromagnetic layers 32 and t 34 are directed to the same direction as the external magnetic field $H_E$.

As thus described, the synthetic antiferromagnet structure 30B allows the magnetizations of the respective ferromagnetic layers to be directed to desired direction by applying the sufficiently large external magnetic field $H_E$ to the direction opposite to the direction to which the magnetizations of the first ferromagnetic layer 31 and the third ferromagnetic layer 33 are to be directed.

Figure 11C:
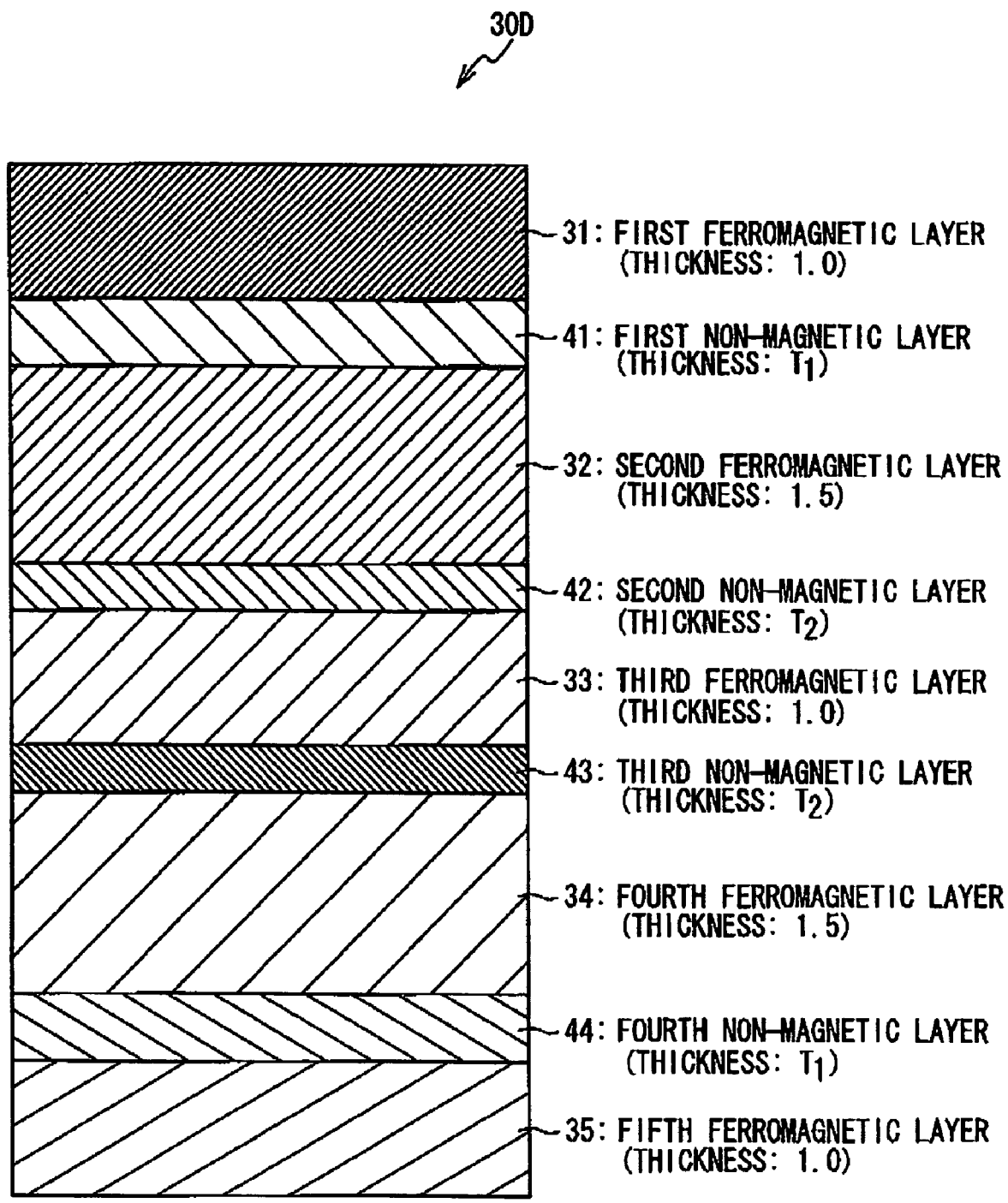
FIG. 11C is a cross sectional view showing still another synthetic antiferromagnet structure applied in the second embodiment of the magnetization direction control method of the present invention.

Shown in FIG. 11C is another synthetic antiferromagnet structure 30C including five ferromagnetic layers. The synthetic antiferromagnet structure 30C includes first to fifth ferromagnetic layers 31 to 35, and first to fourth non-magnetic layers 41 to 44 interposed therebetween. The first to fifth ferromagnetic layers 31 to 35 are formed of the same material with a film thickness ratio of 1.0:1.5:1.0:1.5:1.0. This causes the sum of the products of the film thicknesses and the magnetization magnitudes of the odd-numbered ferromagnetic layers to be equal to that of the even-numbered ferromagnetic layers, in which the net magnetic moment of the synthetic antiferromagnet structure 10B is adjusted to zero.

Nevertheless, the synthetic antiferromagnet structure 30C as mentioned above suffers from the fact that the order of reversing the magnetizations of the respective ferromagnetic layers in the decrease of the external magnetic field $H_E$ is not decided by the product of the film thicknesses and the magnetization magnitudes, because the first ferromagnetic layer 31, the third ferromagnetic layer 33 and the fifth ferromagnetic layer 35 have the same product of the film thickness and the magnetization magnitude.

Instead, the synthetic antiferromagnet structure 30B is configured so that the coupling coefficients of the antiferromagnetic couplings across the first and fourth non-magnetic layers 41 and 44 are smaller than the coupling coefficient of the antiferromagnetic coupling across the second and third non-magnetic layers 42 and 43. More specifically, the second and third non-magnetic layers 41 and 42 have the same film thickness $T_2$, which is adjusted to have the smallest film thickness out of the film thicknesses at which the coupling coefficient exhibits local maximum value. The first and fourth non-magnetic layers 41 and 44, on the other hand, have the same film thickness $T_1$, which is adjusted to have the second smallest film thickness out of the film thicknesses at which the coupling coefficient exhibits local maximum value.

As a result, the magnetization of the third ferromagnetic layer 33 is first reversed in the process of decreasing the external magnetic field $H_E$. It will be easily understood that the first magnetization reversal of the third ferromagnetic layer 33 determines the magnetization directions of the remaining ferromagnetic layers.

The magnetization direction control method mentioned above is applicable to any of the fixed layer and the free layer of the MRAM memory cell. A description is made of applications of the synthetic antiferromagnet structure to a fixed layer and a free layer in the following.

(Application of the Magnetization Direction Control Method of the Present Invention to the Fixed Layer)

Figure 13:
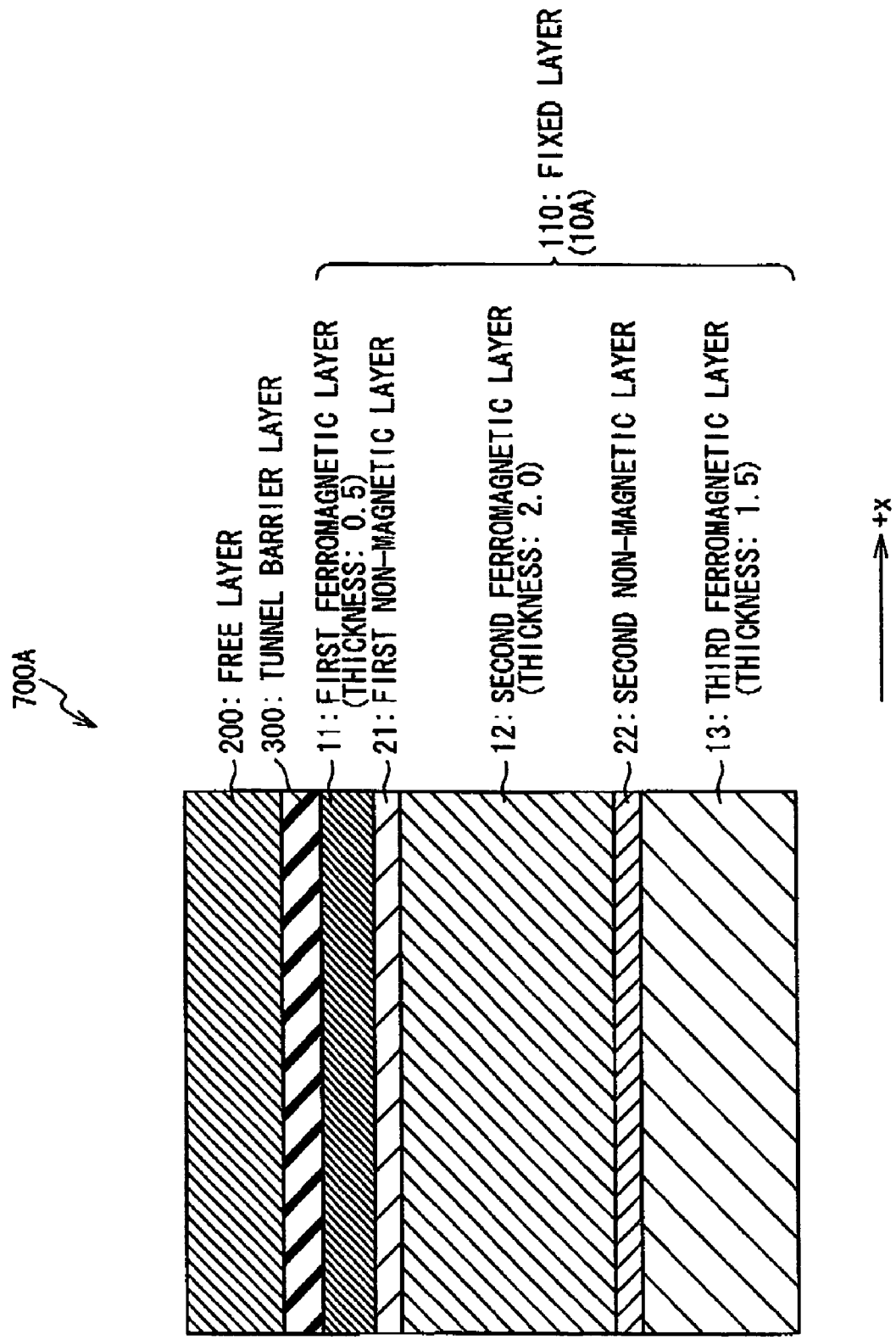
FIG. 13 is a cross sectional view of an MRAM memory cell including a synthetic antiferromagnet structure as a fixed layer to which the magnetization direction control method of the present invention is applied.

FIG. 13 is a cross sectional view showing the structure of a memory cell 700A adapted to the application of the magnetization direction control method of the present invention to the fixed layer. The memory cell 700A includes a fixed layer 110, a free layer 200, and a tunnel barrier layer 300 interposed therebetween. The fixed layer 110 has the same structure as the synthetic antiferromagnet structure 10A in FIG. 8A.

Magnetizations of first to third ferromagnetic layers 11 to 13 within the fixed layer 110 are directed to desired directions by annealing in a state in which the external magnetic field $H_E$ is applied in the MRAM manufacturing process. The external magnetic field $H_E$ is directed in a direction parallel to the easy axes of the first to third ferromagnetic layers 11 to 13 and opposite to the direction to which the first ferromagnetic layer 11 and the third ferromagnetic layer 13 are to be directed. Further, the strength of the external magnetic field $H_E$ is controlled so as to be strong enough to direct the magnetizations of all the first to third ferromagnetic layers 11 to 13 in the same direction. After the external magnetic field $H_E$ as mentioned above is applied and then the external magnetic field $H_E$ is removed, the magnetizations of the first and third ferromagnetic layers 11 and 13 are selectively reversed. This process achieves directing the magnetizations of the first to third ferromagnetic layers 11 to 13 to desired directions.

The application of the magnetization direction control method of the present invention to a fixed layer enables to exclude an antiferromagnetic layer from the MRAM memory cell, and advantageously improves properties of the MRAM memory cell.

Figure 14:
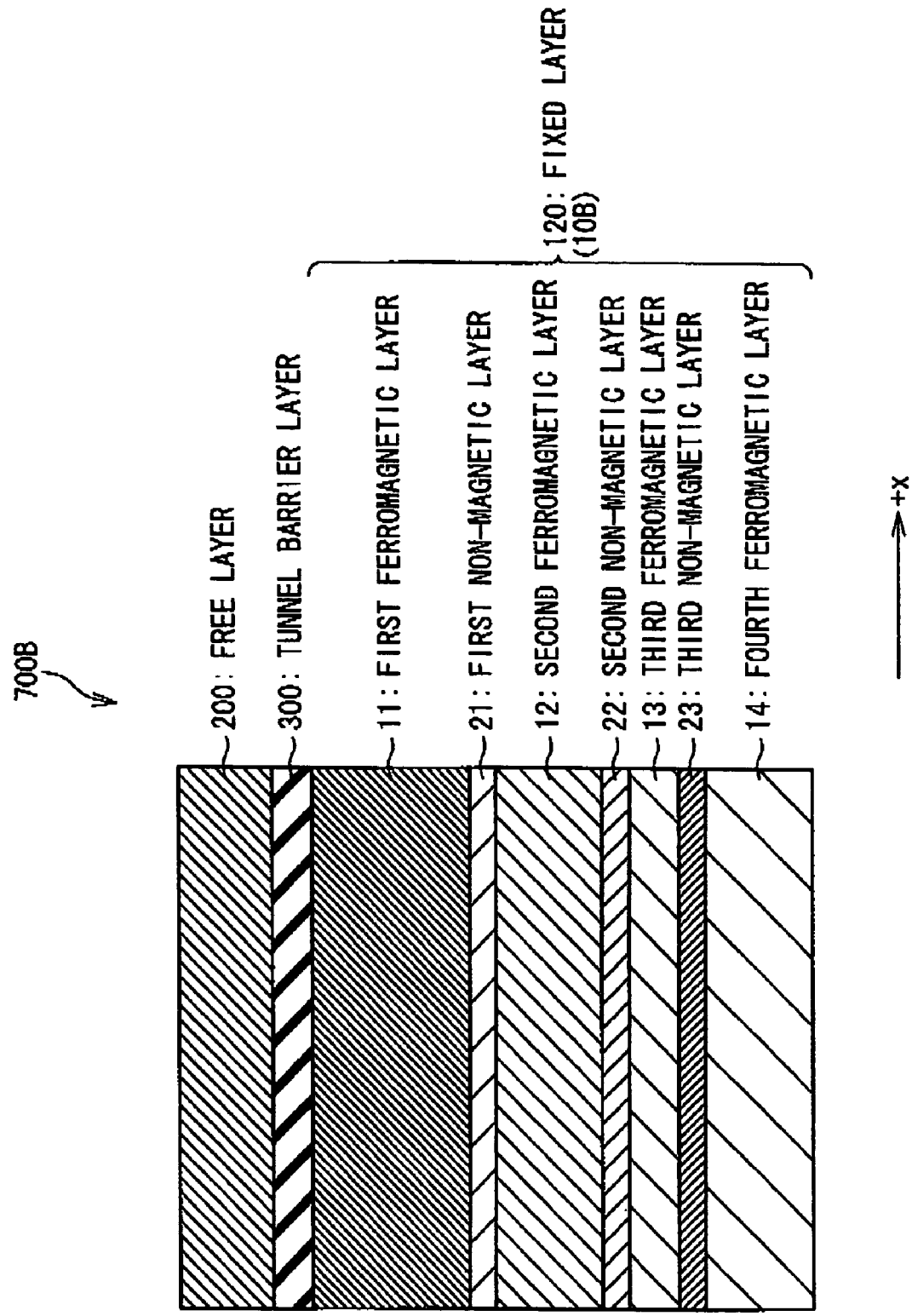
FIG. 14 is a cross sectional view of another MRAM memory cell including a synthetic antiferromagnet structure as a fixed layer to which the magnetization direction control method of the present invention is applied.
Figure 15:
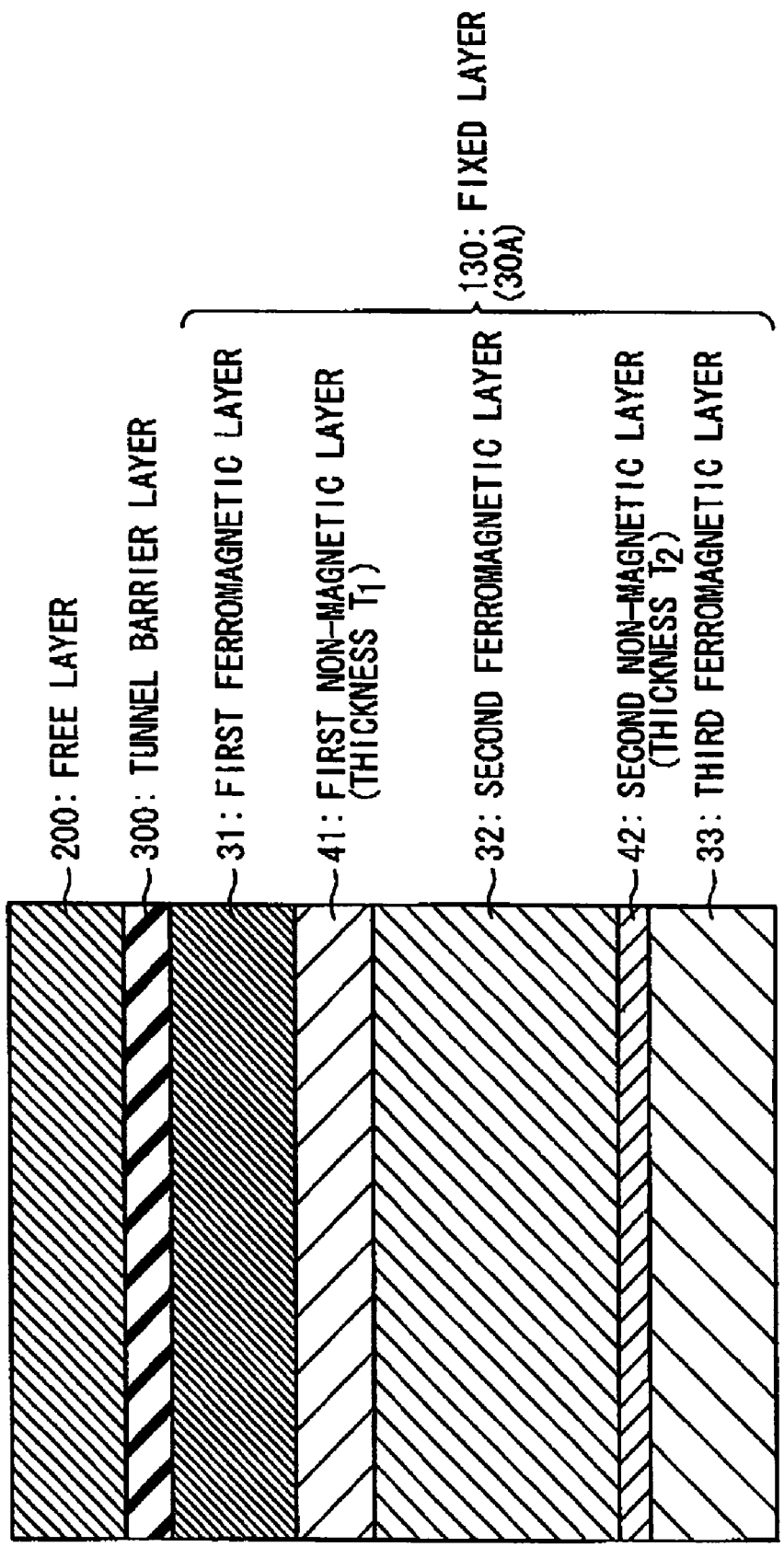
FIG. 15 is a cross sectional view of still another MRAM memory cell including a synthetic antiferromagnet structure as a fixed layer to which the magnetization direction control method of the present invention is applied.
Figure 16:
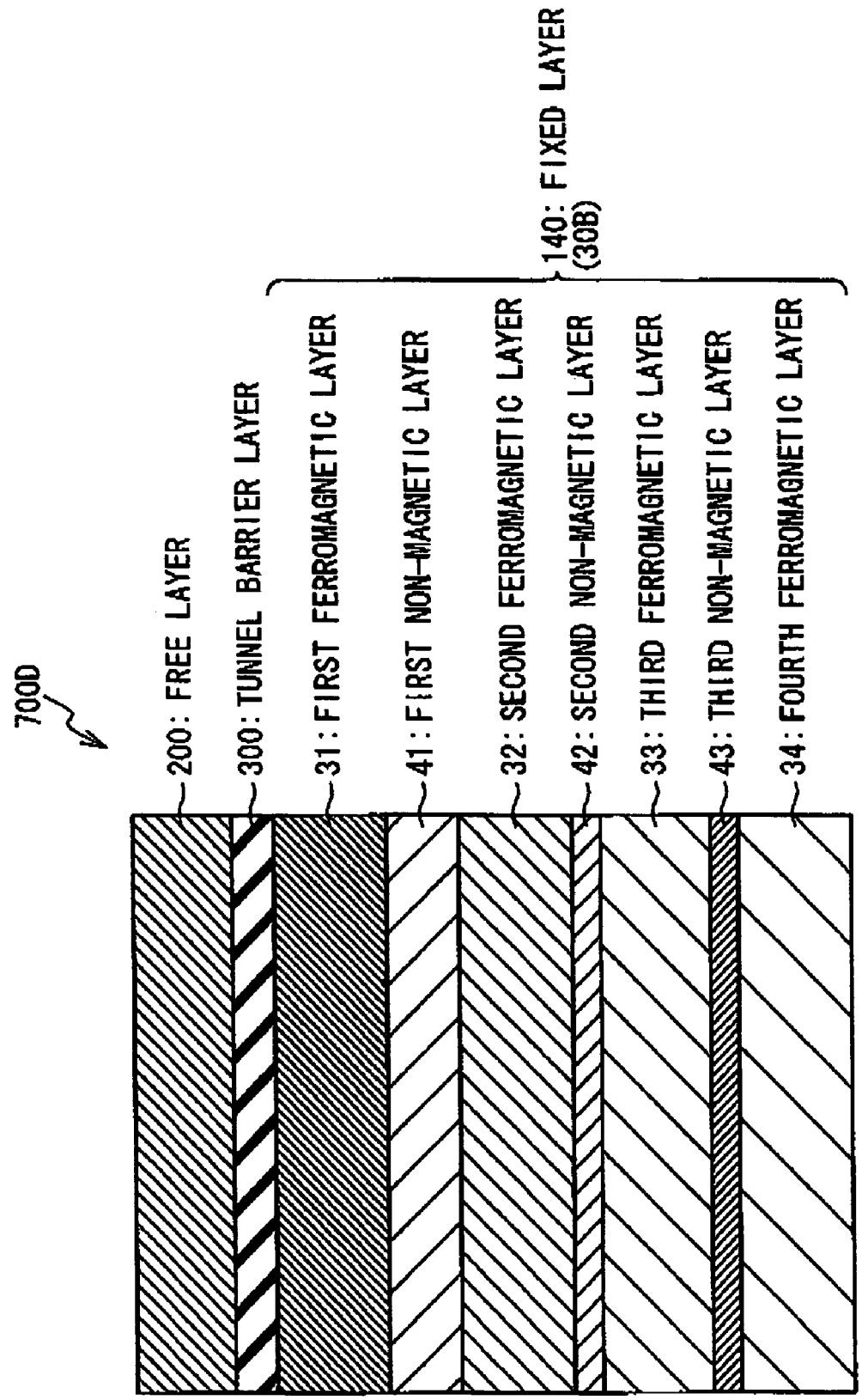
FIG. 16 is a cross sectional view of still another MRAM memory cell including a synthetic antiferromagnet structure as a fixed layer to which the magnetization direction control method of the present invention is applied.

The other synthetic antiferromagnet structures mentioned above may be also used as a fixed layer of the MRAM memory cell. For example, FIG. 14 shows the structure of a memory cell 700B including the synthetic antiferromagnet structure 10B in FIG. 8B as a fixed layer 120. FIG. 15 shows a structure of a memory cell 700C including the synthetic antiferromagnet structure 30A in FIG. 11A as a fixed layer 130. FIG. 16 shows a structure of a memory cell 700D including the synthetic antiferromagnet structure 30B in FIG. 11B as a fixed layer 140.

(Application of the Magnetization Direction Control Method of the Present Invention to the Free Layer)

Figure 17:
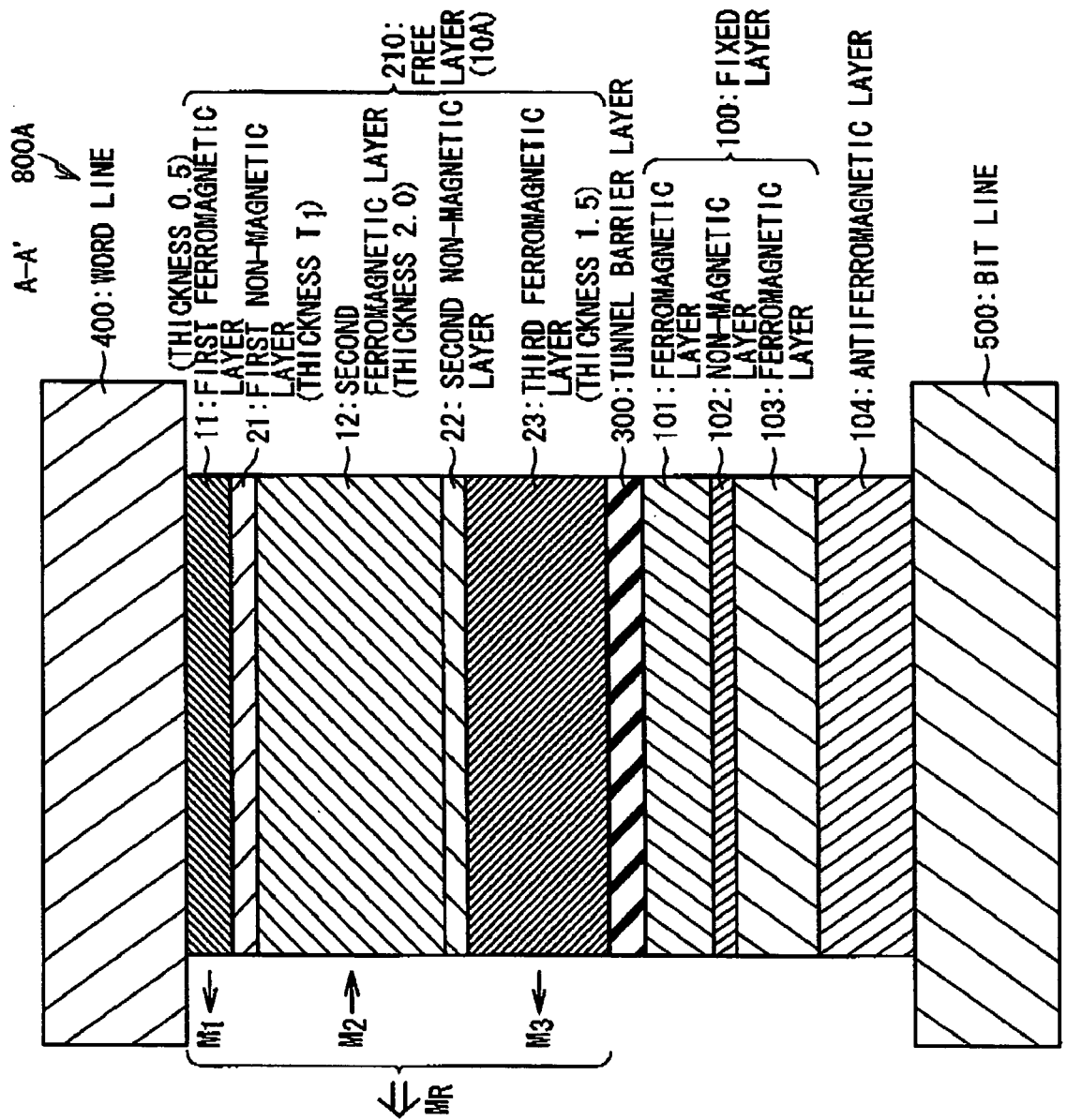
FIG. 17 is a cross sectional view of an MRAM memory cell including a synthetic antiferromagnet structure as a free layer to which the magnetization direction control method of the present invention is applied.

FIG. 17 is a cross sectional view showing the structure of the MRAM memory array adapted to the application of the magnetization direction control method of the present invention to a free layer. The MRAM memory array includes a word line 400, a bit line 500 and a memory cell 800A. The memory cell 800A is interposed between the word line 400 and the bit line 500. As shown in FIG. 18, the word line 400 and the bit line 500 are disposed perpendicularly to each other. The memory cell 800A is disposed at an intersection of the word line 400 and the bit line 500. It should be noted that the X-axis is defined as being parallel to the word line 400 and the Y-axis is defined as being parallel to the bit line 500 in the following. Although only one word line 400, one bit line 500 and one memory cell 800A are shown in FIGS. 17 and 18, it must be understood that a plurality of the word lines 400, the bit lines 500 and the memory cells 800A are disposed to form a memory array as in an usual MRAM. The word line 400 and the bit line 500 are connected to a write/read circuit (not shown) for writing and reading data. The write/read circuit is generally composed of a word line decoder, a bit line decoder, a sense amplifier, a write amplifier and a read amplifier.

As shown in FIG. 17, the memory cell 800A includes a fixed layer 100, a free layer 210, and a tunnel barrier layer 300 interposed therebetween. The fixed layer 100 has the same structure as a conventional synthetic antiferromagnet structure; the fixed layer 100 includes ferromagnetic layers 101 and 102, and a non-magnetic layer 103 interposed therebetween, in which the ferromagnetic layer 102 is connected to an antiferromagnetic layer 104. The free layer 210 has the same structure as the synthetic antiferromagnet structure 10A in FIG. 8A. It should be noted that the synthetic antiferromagnet structures of the present invention mentioned above may be also used as the fixed layer 100. The application of the synthetic antiferromagnet structures of the present invention to the fixed layer enables to exclude an antiferromagnetic layer from the MRAM memory array, and advantageously improves properties of the memory cell 800A. In this case, it is preferable that the flop field of the free layer is adjusted sufficiently smaller than the flop magnetic field of the fixed layer.

As shown in FIG. 18, the memory cell 800A has a long shape in the direction at an angle of 45 degrees to both of the word line 400 and the bit line 500. The shape of the memory cell 800A allows the easy axes of the first to third ferromagnetic layers 11 to 13 within the free layer 210 to be directed at an angle of 45 degrees to both the x-axis and y-axis. In the following explanation, the X-axis is defined as being parallel to the easy axes of the first to third ferromagnetic layers 11 to 13, and the Y-axis is defined as being perpendicular to the easy axes. The X-axis forms an angle of 45 degrees to the x-axis, and the Y-axis forms an angle of 45 degrees to the y-axis. It should be noted that the x-y coordinate system is defined differently from the X-Y coordinate system.

Figure 19:
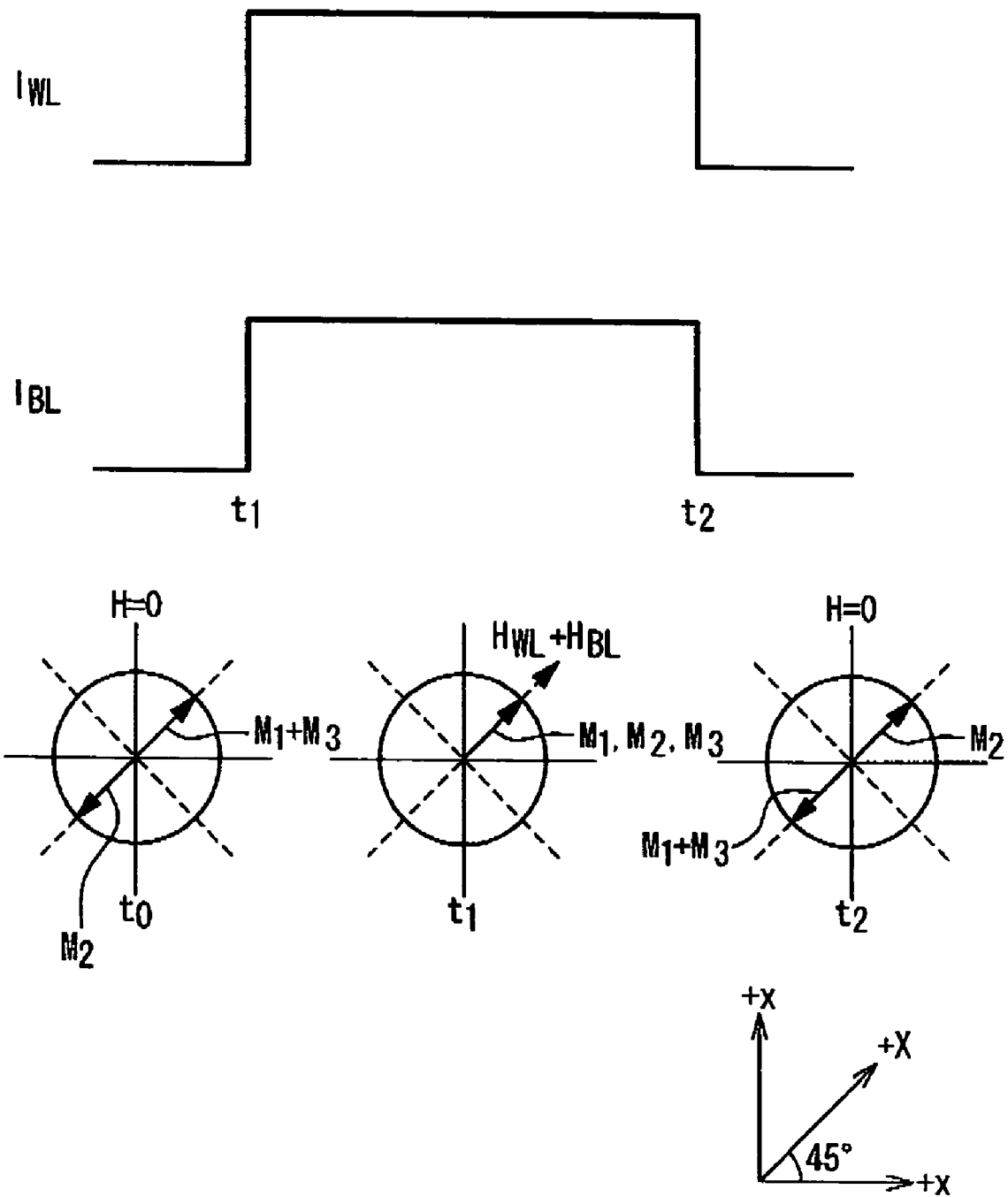
FIG. 19 is a timing chart showing an write operation into a selected cell.

FIG. 19 is a timing chart showing a write operation into a memory cell 800A. The data write into the memory cell 800A is achieved as follows. Initially, in the memory cell 800A on which the write operation is to be performed (referred to as the selected cell hereinafter), the magnetizations $M_1$ and $M_3$ of the first and third ferromagnetic layers 11 and 13 are directed to the +X direction, and the magnetization $M_2$ of the second ferromagnetic layers 12 is directed to the −X direction. The magnetization directions are reversed by writing data as explained below.

Firstly, a word line 400 and a bit line 500 associated with the selected cell are selected. The selected word line 400 is referred to as a selected word line and the selected bit line 500 is referred to as a selected bit line, hereinafter.

This is followed by applying write currents $I_{WL}$ and $I_{BL}$ to the selected bit line and the selected word line, respectively, by the write/read circuit. The directions of the write currents $I_{WL}$ and $I_{BL}$ are determined depending on data to be written into the selected cell. In this embodiment, the directions of the write currents $I_{WL}$ and $I_{BL}$ are the +x direction and the +y direction, respectively. The write currents $I_{WL}$ and $I_{BL}$ start to be applied substantially at the same time.

The write currents $I_{WL}$ and $I_{BL}$ generate a magnetic field $H_{WL}$ in the +y direction and a magnetic field $H_{BL}$ in the +x direction. The magnitudes of the write currents $I_{WL}$ and $I_{BL}$ are adjusted to be sufficient for directing the direction of the resultant magnetic field $H_{WL}+H_{BL}$ generated by the magnetic fields $H_{WL}$ and $H_{BL}$ is directed in the direction parallel to the easy axes of the first to third ferromagnetic layers 11 to 13, and for allowing the resultant magnetic field $H_{WL}+H_{BL}$ to direct the magnetizations of the first to third ferromagnetic layers 11 to 13 in the same direction. The application of the resultant magnetic field $H_{WL}+H_{BL}$ results in that the magnetizations $M_1$ to $M_3$ of all the first to third ferromagnetic layers 11 to 13 are directed in the direction parallel to the easy axes, that is, the +X direction.

This is followed by shutdown of the currents $I_{WL}$ and $I_{BL}$. The suspension of providing the currents $I_{WL}$ and $I_{BL}$ results in the shutdown of the magnetic field having been applied to the first to third ferromagnetic layers 11 to 13 within the synthetic antiferromagnet structure. The shutdown of the magnetic field having been applied to the first to third ferromagnetic layers 11 to 13 causes the magnetizations of the first and third ferromagnetic layers 11 and 13 to be selectively reversed in accordance with the process described above. As a result, the magnetizations $M_1$ and $M_3$ of the first ferromagnetic layer 11 and the third ferromagnetic layer 13 are reversed to the −X direction, and the magnetization $M_2$ of the second ferromagnetic layer 12 is reversed to the +X direction as desired.

The write operation mentioned above achieves directing magnetizations of the ferromagnetic layers in the free layer 210 to desired directions regardless of the original magnetization directions thereof; in other words, the write operation mentioned above allows performing the write operation without the read operation.

Figure 20:
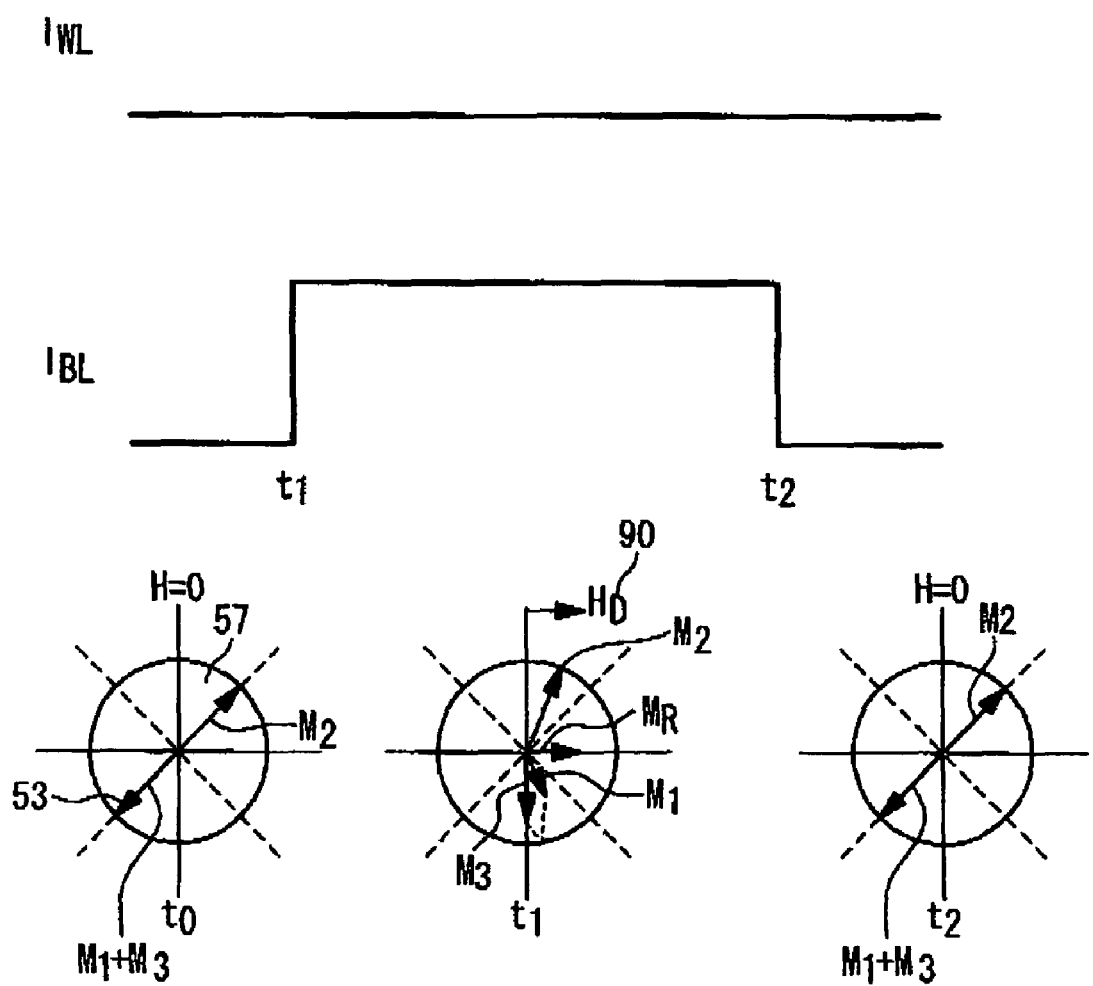
FIG. 20 is a timing chart showing an operation of an unselected cell.

In addition, the write operation mentioned above has an advantage of superior selectivity of the memory cells. FIG. 20 shows an operation of a non-selected memory cell of the memory cells 800A connected to the selected bit line. Applying the current $I_{BL}$ results in that the magnetic field $H_{BL}$ is applied to the non-selected memory cell in the +x direction, that is, in the direction at the angle of 45 degrees to the easy axis. Accordingly, the application of the magnetic field $H_{BL}$ causes the magnetizations $M_1$ to $M_3$ of the first to third ferromagnetic layers 11 to 13 in the non-selected memory cell to be rotated to a certain direction so that the resultant magnetization $M_R$ is directed to the magnetic field $H_{BL}$. However, the direction of the magnetization $M_2$ can not be switched with the directions of the magnetizations $M_1$ to $M_3$ under this condition (if the influence of thermal disturbance is ignored). Therefore, the magnetization reversal is not observed in the non-selected memory cell. This implies that the memory cells exhibits superior selectivity.

As thus described, the application of the magnetization direction control method according to the present invention to the free layer realizes a write operation which requires no read operation, and allows the magnetic moment of the free layer to be zero, achieving high selectivity of the memory cells.

Figure 21:
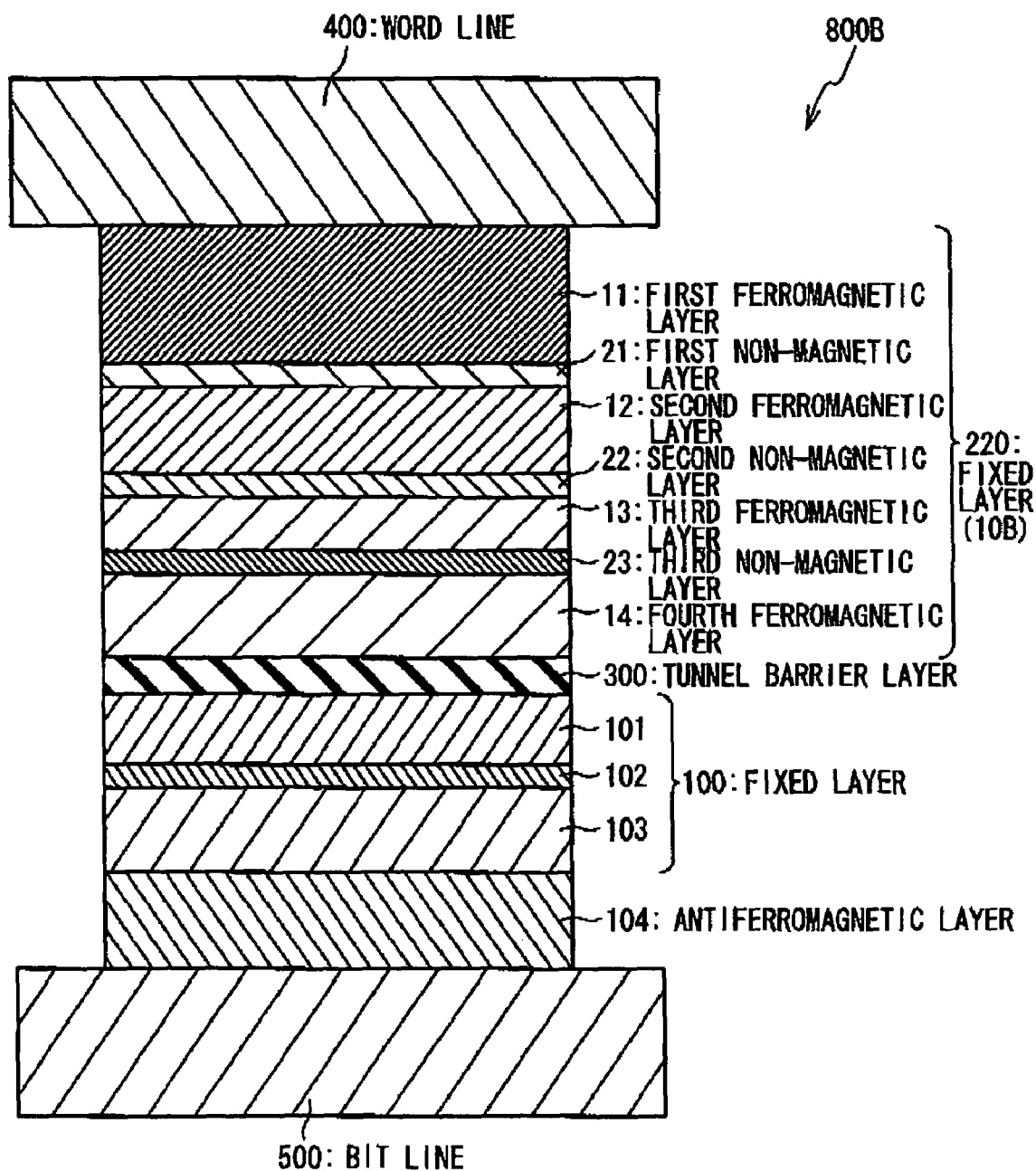
FIG. 21 is a cross sectional view of another MRAM memory cell including a synthetic antiferromagnet structure as a free layer to which the magnetization direction control method of the present invention is applied.
Figure 22:
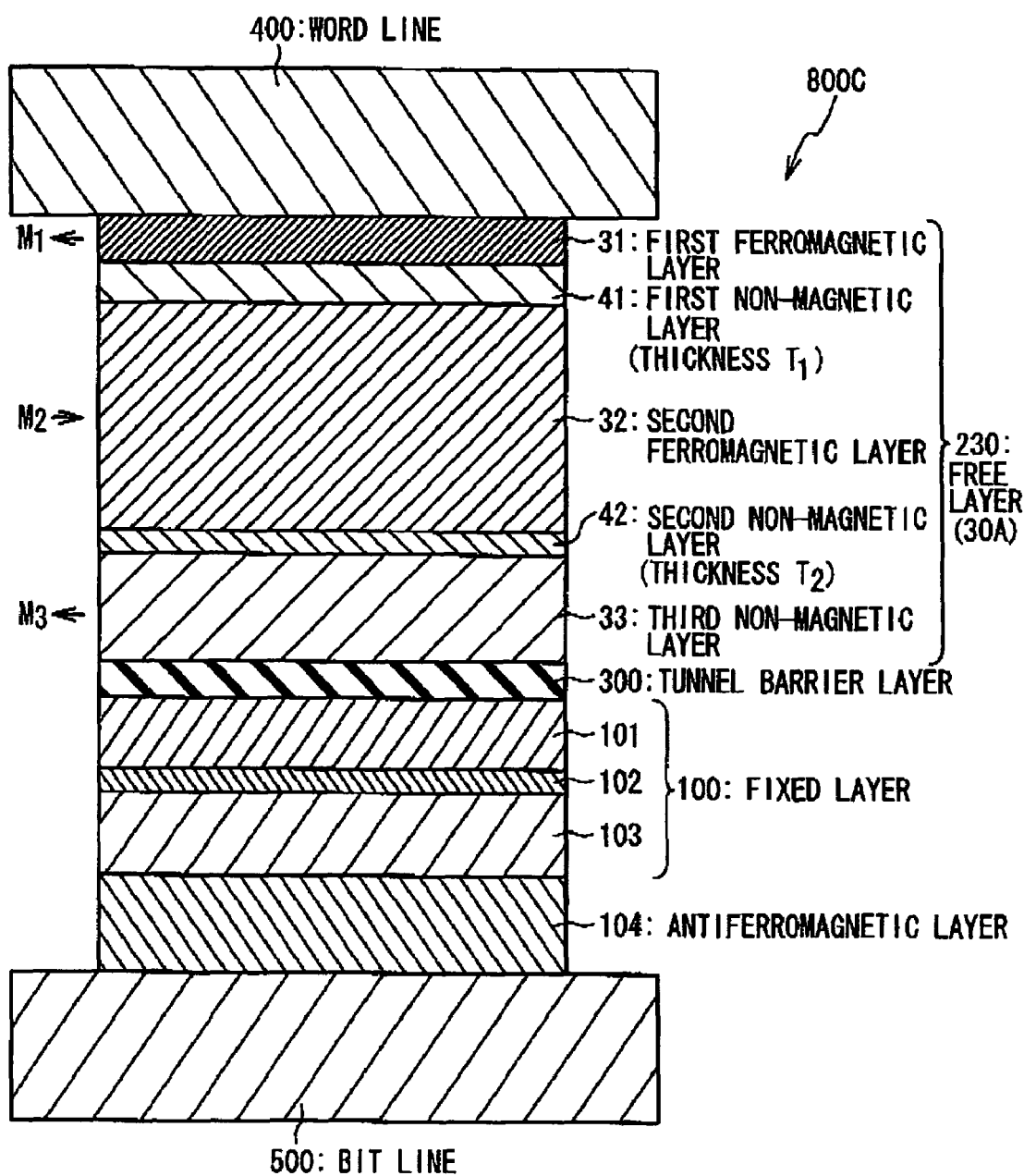
FIG. 22 is a cross sectional view of still another MRAM memory cell including a synthetic antiferromagnet structure as a free layer to which the magnetization direction control method of the present invention is applied.
Figure 23:
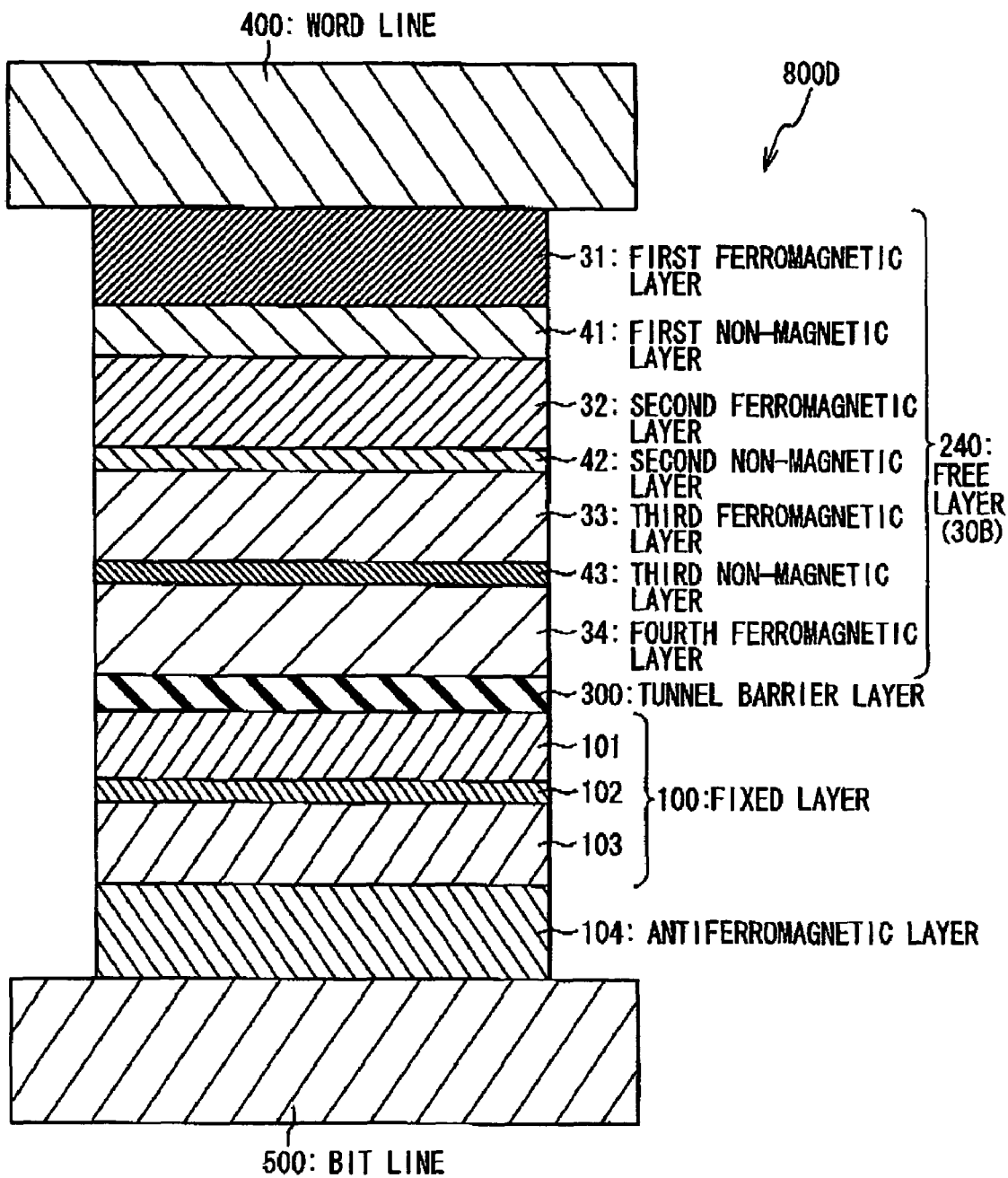
FIG. 23 is a cross sectional view of still another MRAM memory cell including a synthetic antiferromagnet structure as a free layer to which the magnetization direction control method of the present invention is applied.

The other synthetic antiferromagnet structures mentioned above may be similarly used as a free layer within an MRAM memory cell. For example, FIG. 21 shows a structure of a memory cell 800B including the synthetic antiferromagnet structure 10B in FIG. 8B as the free layer 220. FIG. 22 shows a structure of a memory cell 800C including the synthetic antiferromagnet structure 30A in FIG. 11A as a free layer 230. FIG. 23 shows a structure of a memory cell 800D including the synthetic antiferromagnet structure 30B in FIG. 11B as a free layer 240.

Although there are shown structures of magneto-resistance elements adapted to a cross-point cell array, that is, structures in which magneto-resistance elements 800A to 800D are electrically connected to the word line 400 and the bit line 500 in FIG. 17 and FIGS. 21 to 23, it must not be understood that the present invention is only applicable to a cross-point cell array. When the present invention is applied to an MRAM memory array in which memory cells are selected by transistors, the word line 400 is electrically insulated from the magneto-resistance elements 800A to 800D. Also in this case, it must also be understood that the word line 400 is positioned near the magneto-resistance elements 800A to 800D so as to apply magnetic fields to the magneto-resistance elements 800A to 800D.

The invention claimed is:

1. A magnetization direction control method applied to a synthetic antiferromagnet structure including N ferromagnetic layers (N is an integer equal to or more than three) and (N−1) non-magnetic layers interposed therebetween, for controlling magnetization directions of said N ferromagnetic layers without coupling antiferromagnetic material with said synthetic antiferromagnet structure, said method comprising:
   (a) applying an external magnetic field to said synthetic antiferromagnet structure to thereby directing magnetizations of said N ferromagnetic layers in the substantially same direction;
   (b) decreasing said external magnetic field to allow magnetizations of one or some of said N ferromagnetic layers to be reversed,
   wherein said synthetic antiferromagnet structure is designed so that a magnetization of one of said N ferromagnetic layers is reversed more easily than magnetizations of the remaining ferromagnetic layers, in a state in which magnetizations of said N ferromagnetic layers are directed in the same direction.

2. The magnetization direction control method according to claim 1, wherein a sum of products of film thicknesses and magnetization magnitudes of odd-numbered ones of said N ferromagnetic layers is substantially equal to that of even-numbered one(s) of said N ferromagnetic layers.

3. The magnetization direction control method according to claim 1, wherein said synthetic antiferromagnet structure is configured so that a product of a film thickness and a magnetization magnitude of said one of said N ferromagnetic layers is smaller than those of said remaining ferromagnetic layers.

4. The magnetization direction control method according to claim 1, wherein said N ferromagnetic layers are formed of the same ferromagnetic material, and
   wherein said one of said N ferromagnetic layers has a thickness thinner than those of said remaining ferromagnetic layers.

5. The magnetization direction control method according to claim 1, wherein said one of said N ferromagnetic layers is selected from among odd-numbered ferromagnetic layers out of said N ferromagnetic layers, and
   wherein products of film thicknesses and magnetization magnitudes of said odd-numbered ferromagnetic layer are smaller than that (those) of an even-numbered ferromagnetic layer(s) of said N ferromagnetic layers.

6. The magnetization direction control method according to claim 1, wherein said one of said N ferromagnetic layers is selected from among an even-numbered ferromagnetic layer(s) out of said N ferromagnetic layers, and
   wherein a product(s) of a film thickness(es) and magnetization magnitude(s) of said even-numbered ferromagnetic layer(s) is smaller than those of odd-numbered ferromagnetic layers of said N ferromagnetic layers.

7. The magnetization direction control method according to claim 1, wherein said synthetic antiferromagnet structure is configured to allow the magnetization of said one of said N ferromagnetic layers to be reversed more easily than those of said remaining ferromagnetic layers due to the fact that a coupling coefficient of an antiferromagnetic coupling across one of said (N−1) non-magnetic layers is different from that (those) of the remaining non-magnetic layer(s).

8. The magnetization direction control method according to claim 1, wherein said (N−1) non-magnetic layers are configured so that a strength of an antiferromagnetic coupling between said one of said N ferromagnetic layers and a ferromagnetic layer adjacent thereto is stronger than a strength of an antiferromagnetic coupling between each remaining ferromagnetic layer and a ferromagnetic layer adjacent thereto.

9. The magnetization direction control method according to claim 1, wherein N is three, and
   wherein said one of said N ferromagnetic layers is positioned at an end of said synthetic antiferromagnet structure.

10. The magnetization direction control method according to claim 1, wherein N is four, and
    wherein said one of said N ferromagnetic layers is selected from intermediate two ferromagnetic layers of said synthetic antiferromagnet structure.

11. The magnetization direction control method according to claim 1, wherein N is five, and
    wherein said one of said N ferromagnetic layers is the ferromagnetic layer positioned at the third position of said synthetic antiferromagnet structure.

12. An MRAM manufacture method comprising:
    (a) forming an MRAM memory cell including a fixed layer of a synthetic antiferromagnet structure comprising N ferromagnetic layers (N is an integer equal to or more than three) and (N−1) non-magnetic layers interposed therebetween, said MRAM memory cell being configured so that no antiferromagnetic material is not in contact with said synthetic antiferromagnet structure;
    (b) applying an external magnetic field to said synthetic antiferromagnet structure to thereby directing magnetizations of said N ferromagnetic layers in the substantially same direction;
    (c) decreasing said external magnetic field to allow magnetizations of one or some of said N ferromagnetic layers to be reversed,
    wherein said synthetic antiferromagnet structure is designed so that a magnetization of one of said N ferromagnetic layers is reversed more easily than magnetizations of the remaining ferromagnetic layers, in a state in which magnetizations of said N ferromagnetic layers are directed in the same direction.

13. The magnetization direction control method according to claim 12, wherein a sum of products of film thicknesses and magnetization magnitudes of odd-numbered ones of said N ferromagnetic layers is substantially equal to that of even-numbered one(s) of said N ferromagnetic layers.

14. The magnetization direction control method according to claim 13, wherein said synthetic antiferromagnet structure is configured so that a product of a film thickness and a magnetization magnitude of said one of said N ferromagnetic layers is smaller than those of said remaining ferromagnetic layers.

15. The magnetization direction control method according to claim 13, wherein said synthetic antiferromagnet structure is configured to allow the magnetization of said one of said N ferromagnetic layers to be reversed more easily than those of said remaining ferromagnetic layers due to the fact that a coupling coefficient of an antiferromagnetic coupling across one of said (N−1) non-magnetic layers is different from that (those) of the remaining non-magnetic layer(s).

16. An MRAM comprising:
    a plurality of first interconnections extending in a first direction;
    a plurality of second interconnections extending in a second direction perpendicular to said first direction;
    memory cells disposed at respective intersections of said first and second interconnections; and
    a write circuit applying a first write current to a first selected interconnection selected out of said plurality of first interconnections, and applying a second write current to a second selected interconnection selected out of said plurality of second interconnections, wherein each of said memory cells include:
- a fixed layer;
- a free layer formed of a synthetic antiferromagnet structure comprising N ferromagnetic layers (N is an integer equal to or more than three) and (N−1) non-magnetic layers interposed therebetween; and
- a spacer layer interposed between said free layer and said fixed layer, wherein easy axes of said N ferromagnetic layers are oblique to both of said first and second directions, wherein said synthetic antiferromagnet structure is designed so that a magnetization of one of said N ferromagnetic layers is reversed more easily than magnetizations of the remaining ferromagnetic layers, in a state in which magnetizations of said N ferromagnetic layers are directed in the same direction, and wherein said first and second write currents are generated so that a resultant magnetic field is generated in a direction parallel to said easy axes, said resultant magnetic field having such a magnitude that magnetizations of said N ferromagnetic layers within said memory cell at which said first and second selected interconnections intersect are directed in substantially the same direction.

17. The MRAM according to claim 16, wherein a direction of said easy axes form an angle of 45 degrees to both of said first and second direction.

18. The MRAM according to claim 16, wherein applications of said first and second write currents are started substantially at the same time.

19. The MRAM according to claim 16, wherein a sum of products of film thicknesses and magnetization magnitudes of odd-numbered ones of said N ferromagnetic layers is substantially equal to that of even-numbered one(s) of said N ferromagnetic layers.

20. The MRAM according to claim 16, wherein said synthetic antiferromagnet structure is configured so that a product of a film thickness and a magnetization magnitude of said one of said N ferromagnetic layers is smaller than those of said remaining ferromagnetic layers.

21. The MRAM according to claim 20, wherein said N ferromagnetic layers are formed of the same ferromagnetic material, and
wherein said one of said N ferromagnetic layers has a thickness thinner than those of said remaining ferromagnetic layers.

22. The MRAM according to claim 16, wherein said one of said N ferromagnetic layers is selected from among odd-numbered ferromagnetic layers out of said N ferromagnetic layers, and
wherein products of film thicknesses and magnetization magnitudes of said odd-numbered ferromagnetic layer are smaller than that (those) of an even-numbered ferromagnetic layer(s) of said N ferromagnetic layers.

23. The MRAM according to claim 16, wherein said one of said N ferromagnetic layers is selected from among an even-numbered ferromagnetic layer(s) out of said N ferromagnetic layers, and
wherein a product(s) of a film thickness(es) and magnetization magnitude(s) of said even-numbered ferromagnetic layer(s) is smaller than those of odd-numbered ferromagnetic layers of said N ferromagnetic layers.

24. The MRAM according to claim 16, wherein said synthetic antiferromagnet structure is configured to allow the magnetization of said one of said N ferromagnetic layers to be reversed more easily than those of said remaining ferromagnetic layers due to the fact that a coupling coefficient of an antiferromagnetic coupling across one of said (N−1) non-magnetic layers is different from that (those) of the remaining non-magnetic layer(s).

25. The MRAM according to claim 24, wherein said (N−1) non-magnetic layers are configured so that a strength of an antiferromagnetic coupling between said one of said N ferromagnetic layers and a ferromagnetic layer adjacent thereto is stronger than a strength of an antiferromagnetic coupling between each remaining ferromagnetic layer and a ferromagnetic layer adjacent thereto.

26. An MRAM operating method for an MRAM which includes;
- a plurality of first interconnections extending in a first direction;
- a plurality of second interconnections extending in a second direction perpendicular to said first direction;
- memory cells disposed at respective intersections of said first and second interconnections; and wherein each of said memory cells include:
- a fixed layer;
- a free layer formed of a synthetic antiferromagnet structure comprising N ferromagnetic layers (N is an integer equal to or more than three) and (N−1) non-magnetic layers interposed therebetween; and
- a spacer layer interposed between said free layer and said fixed layer, wherein easy axes of said N ferromagnetic layers are oblique to both of said first and second directions, wherein said synthetic antiferromagnet structure is designed so that a magnetization of one of said N ferromagnetic layers is reversed more easily than magnetizations of the remaining ferromagnetic layers, in a state in which magnetizations of said N ferromagnetic layers are directed in the same direction, said MRAM operating method comprising:

applying a first write current to a first selected interconnection selected out of said plurality of first interconnections; and applying a second write current to a second selected interconnection selected out of said plurality of second interconnections, wherein said first and second write currents are generated so that a resultant magnetic field is generated in a direction parallel to said easy axes, said resultant magnetic field having such a magnitude that magnetizations of said N ferromagnetic layers within said memory cell at which said first and second selected interconnections intersect are directed in substantially the same direction.

27. The MRAM operating method according to claim 26, wherein applications of said first and second write currents are started substantially at the same time.

* * * * *